US008050876B2

(12) United States Patent
Feen et al.

(10) Patent No.: US 8,050,876 B2
(45) Date of Patent: Nov. 1, 2011

(54) AUTOMATIC ENVIRONMENTAL COMPENSATION OF CAPACITANCE BASED PROXIMITY SENSORS

(75) Inventors: Ken Feen, Dooradoyle (IE); Laurent Coquerel, Dooradoyle (IE); Richardson Jeyapaul, Karnataka (IN); John Anthony Cleary, Kilmallock (IE)

(73) Assignee: Analog Devices, Inc., Norwood, MA (US)

( * ) Notice: Subject to any disclaimer, the term of this patent is extended or adjusted under 35 U.S.C. 154(b) by 1129 days.

(21) Appl. No.: 11/488,484

(22) Filed: Jul. 18, 2006

(65) Prior Publication Data
US 2007/0032967 A1 Feb. 8, 2007

Related U.S. Application Data

(60) Provisional application No. 60/700,688, filed on Jul. 18, 2005.

(51) Int. Cl.
G01R 11/18 (2006.01)
G01R 33/36 (2006.01)
G01R 31/265 (2006.01)
G01C 23/00 (2006.01)

(52) U.S. Cl. ........... 702/57; 702/65; 702/68; 702/116
(58) Field of Classification Search .......... 702/47, 702/50, 57, 65, 94, 107, 120, 122, 183, 188, 702/189; 324/663; 331/17; 345/173, 174
See application file for complete search history.

(56) References Cited

U.S. PATENT DOCUMENTS

| | | |
|---|---|---|
| 4,103,252 A | 7/1978 | Bobick |
| 4,177,421 A | 12/1979 | Thornbury |
| 4,550,310 A | 10/1985 | Yamaguchi et al. |
| 4,554,409 A | 11/1985 | Mitsui et al. |
| 4,570,149 A | 2/1986 | Thornburg et al. |
| 4,582,955 A | 4/1986 | Blesser et al. |
| 4,595,913 A | 6/1986 | Aubuchon et al. |
| 4,616,107 A | 10/1986 | Abe et al. |
| 4,639,720 A | 1/1987 | Rympalski et al. |
| 4,672,154 A | 6/1987 | Rodgers et al. |
| 4,680,430 A | 7/1987 | Yoshikawa et al. |
| 4,686,332 A | 8/1987 | Greanias et al. |
| 4,698,461 A | 10/1987 | Meadows et al. |
| 4,733,222 A | 3/1988 | Evans et al. |

(Continued)

FOREIGN PATENT DOCUMENTS

WO WO 95/01652 1/1995

(Continued)

*Primary Examiner* — Mohamed Charioui
*Assistant Examiner* — Felix Suarez
(74) *Attorney, Agent, or Firm* — Knobbe Martens Olson & Bear LLP

(57) ABSTRACT

Improved capacitive sensor operation is achieved with improved discrimination between environmental drift and apparent drift attributable to human proximity to the sensor. A proximity algorithm detects conditions interpreted as indicating a user is close to, but not touching, a sensor. When such proximity is detected, ambient value calibration is halted, thereby avoiding treating the human's proximity as environmental drift requiring compensation and preventing miscalculation of calibration. The proximity algorithm employs two moving-average filters (implemented in hardware or software) to monitor the CDC output values over time and to make appropriate adjustments to a signal representing the ambient, while distinguishing environmental drift from proximity-induced pseudo-drift. Accurate ambient values allow for improved proximity detection by providing this environmentally compensated average value to an adaptive threshold algorithm which features a fast attack, slow decay peak detection to automatically track and compensate for different response characteristics (typically finger sizes).

32 Claims, 15 Drawing Sheets

U.S. PATENT DOCUMENTS

| | | | |
|---|---|---|---|
| 4,734,685 A | 3/1988 | Watanabe et al. | |
| 4,736,191 A | 4/1988 | Matzke et al. | |
| 4,758,690 A | 7/1988 | Kimura et al. | |
| 4,766,423 A | 8/1988 | Ono et al. | |
| 4,773,024 A | 9/1988 | Faggin et al. | |
| 4,788,385 A | 11/1988 | Kimura et al. | |
| 4,794,208 A | 12/1988 | Watson et al. | |
| 4,802,103 A | 1/1989 | Faggin et al. | |
| 4,820,886 A | 4/1989 | Watson et al. | |
| 4,853,498 A | 8/1989 | Meadows et al. | |
| 4,876,534 A | 10/1989 | Mead et al. | |
| 4,914,624 A | 4/1990 | Dunthorn et al. | |
| 4,918,262 A | 4/1990 | Flowers et al. | |
| 4,922,061 A | 5/1990 | Meadows et al. | |
| 4,935,702 A | 6/1990 | Mead et al. | |
| 4,935,728 A | 6/1990 | Kley et al. | |
| 4,953,928 A | 9/1990 | Anderson et al. | |
| 4,954,967 A | 9/1990 | Takahashi | |
| 4,962,342 A | 10/1990 | Mead et al. | |
| 4,988,982 A | 1/1991 | Rayner et al. | |
| 5,016,008 A | 5/1991 | Gruaz et al. | |
| 5,049,758 A | 9/1991 | Mead et al. | |
| 5,059,920 A | 10/1991 | Anderson et al. | |
| 5,068,622 A | 11/1991 | Mead et al. | |
| 5,073,759 A | 12/1991 | Mead et al. | |
| 5,083,044 A | 1/1992 | Mead et al. | |
| 5,095,284 A | 3/1992 | Mead et al. | |
| 5,107,149 A | 4/1992 | Platt et al. | |
| 5,109,261 A | 4/1992 | Mead et al. | |
| 5,117,071 A | 5/1992 | Greanias et al. | |
| 5,120,907 A | 6/1992 | Shinbori et al. | |
| 5,120,908 A | 6/1992 | Zank et al. | |
| 5,120,996 A | 6/1992 | Mead et al. | |
| 5,126,685 A | 6/1992 | Platt et al. | |
| 5,146,106 A | 9/1992 | Anderson et al. | |
| 5,160,899 A | 11/1992 | Anderson et al. | |
| 5,165,054 A | 11/1992 | Platt et al. | |
| 5,166,562 A | 11/1992 | Allen et al. | |
| 5,204,549 A | 4/1993 | Platt et al. | |
| 5,243,554 A | 9/1993 | Allen et al. | |
| 5,248,873 A | 9/1993 | Allen et al. | |
| 5,260,592 A | 11/1993 | Mead et al. | |
| 5,270,963 A | 12/1993 | Allen et al. | |
| 5,276,407 A | 1/1994 | Mead et al. | |
| 5,289,023 A | 2/1994 | Mead et al. | |
| 5,303,329 A | 4/1994 | Mead et al. | |
| 5,305,017 A | 4/1994 | Gerpheide et al. | |
| 5,324,958 A | 6/1994 | Mead et al. | |
| 5,331,215 A | 7/1994 | Allen et al. | |
| 5,336,936 A | 8/1994 | Allen et al. | |
| 5,339,213 A | 8/1994 | O'Callaghan et al. | |
| 5,349,303 A | 9/1994 | Gerpheide et al. | |
| 5,374,787 A | 12/1994 | Miller et al. | |
| 5,386,219 A * | 1/1995 | Greanias et al. | 345/174 |
| 5,408,194 A | 4/1995 | Steinbach et al. | |
| 5,488,204 A | 1/1996 | Mead et al. | |
| 5,495,077 A | 2/1996 | Miller et al. | |
| 5,541,878 A | 7/1996 | Lemoncheck et al. | |
| 5,543,588 A | 8/1996 | Bisset et al. | |
| 5,543,590 A | 8/1996 | Gillespie et al. | |
| 5,543,591 A | 8/1996 | Gillespie et al. | |
| 5,565,658 A | 10/1996 | Gerpheide et al. | |
| 5,565,889 A | 10/1996 | Box et al. | |
| 5,566,702 A | 10/1996 | Philipp et al. | |
| 5,629,891 A | 5/1997 | LeMoncheck et al. | |
| D389,129 S | 1/1998 | Guintoli | |
| 5,730,165 A | 3/1998 | Philipp et al. | |
| 5,757,368 A | 5/1998 | Gerpheide et al. | |
| 5,763,909 A | 6/1998 | Mead et al. | |
| 5,764,218 A | 6/1998 | Dellabona et al. | |
| 5,767,457 A | 6/1998 | Gerpheide et al. | |
| 5,812,698 A | 9/1998 | Platt et al. | |
| 5,841,078 A | 11/1998 | Miller et al. | |
| 5,844,265 A | 12/1998 | Mead et al. | |
| 5,854,625 A | 12/1998 | Frisch et al. | |
| 5,861,583 A | 1/1999 | Schediwy et al. | |
| 5,861,875 A | 1/1999 | Gerpheide et al. | |
| 5,864,242 A | 1/1999 | Allen et al. | |
| 5,880,411 A | 3/1999 | Gillespie et al. | |
| 5,889,236 A | 3/1999 | Gillespie et al. | |
| 5,914,465 A | 6/1999 | Allen et al. | |
| 5,914,708 A | 6/1999 | Lagrange et al. | |
| 5,920,310 A | 7/1999 | Faggin et al. | |
| 5,926,566 A | 7/1999 | Wang et al. | |
| 5,943,052 A | 8/1999 | Allen et al. | |
| 6,023,422 A | 2/2000 | Allen et al. | |
| 6,028,271 A | 2/2000 | Gillespie et al. | |
| 6,028,959 A | 2/2000 | Wang et al. | |
| 6,043,809 A | 3/2000 | Holehan et al. | |
| 6,097,432 A | 8/2000 | Mead et al. | |
| 6,148,104 A | 11/2000 | Wang et al. | |
| 6,188,391 B1 | 2/2001 | Seely et al. | |
| 6,222,528 B1 | 4/2001 | Gerpheide et al. | |
| 6,239,389 B1 | 5/2001 | Allen et al. | |
| 6,262,717 B1 | 7/2001 | Donohue et al. | |
| 6,288,707 B1 | 9/2001 | Philipp et al. | |
| 6,377,009 B1 | 4/2002 | Philipp et al. | |
| 6,380,929 B1 | 4/2002 | Platt et al. | |
| 6,380,931 B1 | 4/2002 | Gillespie et al. | |
| 6,430,305 B1 | 8/2002 | Decker et al. | |
| 6,452,514 B1 | 9/2002 | Philipp et al. | |
| 6,457,355 B1 | 10/2002 | Philipp et al. | |
| 6,466,036 B1 | 10/2002 | Philipp et al. | |
| 6,466,199 B2 | 10/2002 | Takase et al. | |
| 6,473,069 B1 | 10/2002 | Gerpheide et al. | |
| 6,498,720 B2 | 12/2002 | Glad | |
| 6,508,137 B2 | 1/2003 | Suzuki et al. | |
| 6,574,095 B2 | 6/2003 | Suzuki et al. | |
| 6,639,586 B2 | 10/2003 | Gerpheide et al. | |
| 6,646,631 B2 | 11/2003 | Suzuki et al. | |
| 6,649,924 B1 | 11/2003 | Philipp et al. | |
| 6,680,731 B2 | 1/2004 | Gerpheide et al. | |
| 6,730,863 B1 | 5/2004 | Gerpheide et al. | |
| 6,781,577 B2 | 8/2004 | Shigetaka et al. | |
| 6,897,661 B2 * | 5/2005 | Allen et al. | 324/663 |
| 7,002,417 B2 * | 2/2006 | Maunuksela et al. | 331/17 |
| 7,545,366 B2 * | 6/2009 | Sugimoto et al. | 345/173 |
| 2002/0030666 A1 | 3/2002 | Philipp | |
| 2002/0063688 A1 | 5/2002 | Shaw et al. | |
| 2002/0191029 A1 | 12/2002 | Gillespie et al. | |
| 2003/0025679 A1 | 2/2003 | Taylor et al. | |
| 2003/0132922 A1 | 7/2003 | Philipp | |
| 2003/0156098 A1 | 8/2003 | Shaw et al. | |
| 2003/0160808 A1 | 8/2003 | Foote et al. | |
| 2004/0008129 A1 | 1/2004 | Phillip | |
| 2004/0055446 A1 | 3/2004 | Robbin et al. | |
| 2004/0104826 A1 | 6/2004 | Philipp | |
| 2004/0178997 A1 | 9/2004 | Gillespie et al. | |
| 2004/0252109 A1 | 12/2004 | Trent et al. | |

FOREIGN PATENT DOCUMENTS

| | | |
|---|---|---|
| WO | WO 96/18179 | 6/1996 |
| WO | WO 01/18966 | 3/2001 |

\* cited by examiner

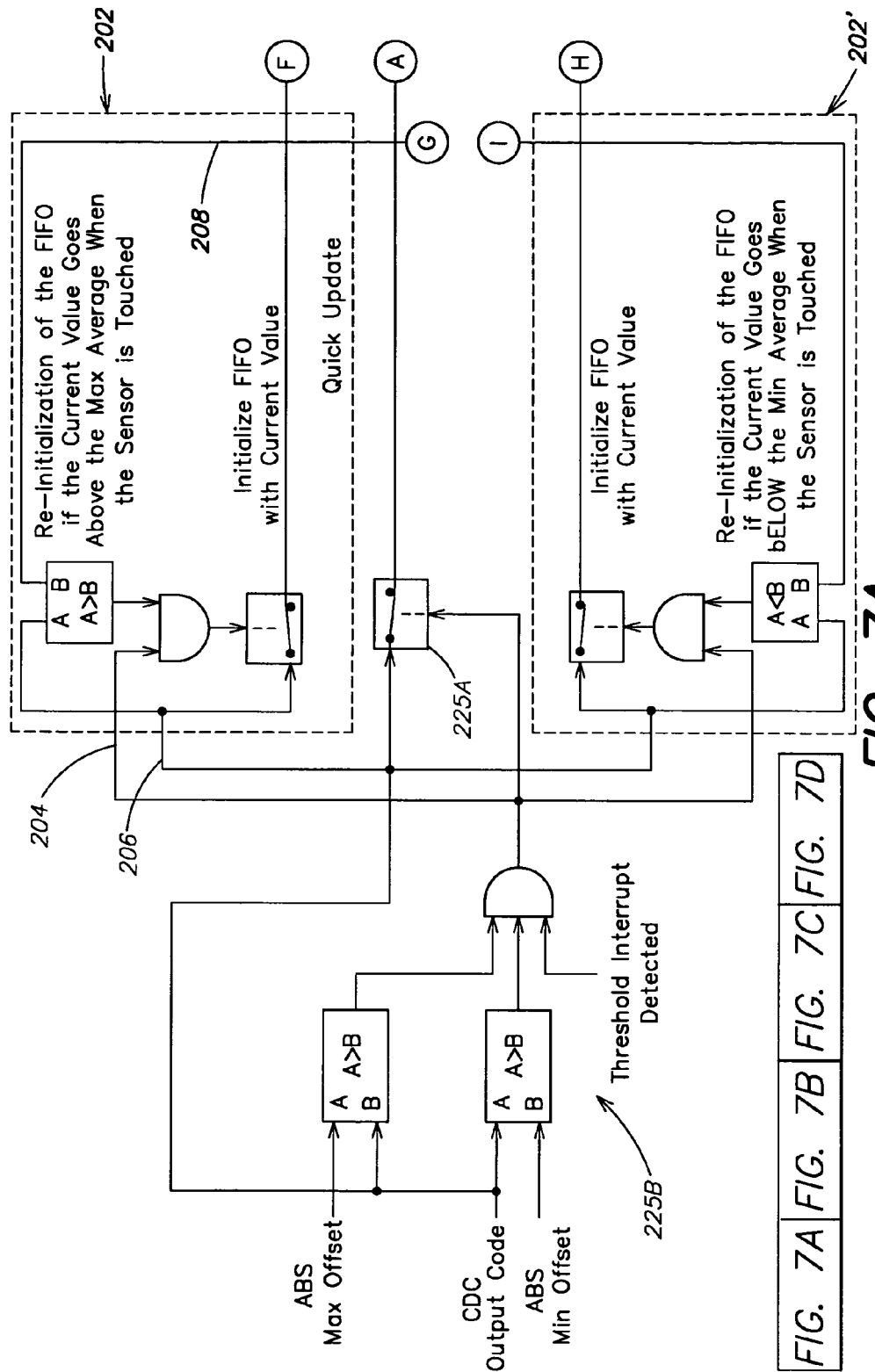

AUTOMATIC ENVIRONMENTAL COMPENSATION OF CAPACITANCE BASED PROXIMITY SENSORS

CROSS-REFERENCE TO RELATED APPLICATIONS

This application claims the benefit under 35 U.S.C. §119(e) of the filing date of U.S. Provisional Patent Application Ser. No. 60/700,688, filed Jul. 18, 2005, which is hereby incorporated by reference.

FIELD OF INVENTION

This invention relates to capacitance-based sensing devices and to drift compensating—i.e., sensitivity stabilizing—such devices. More particularly, it relates to proximity sensors that use capacitive effects, and to compensating their response profiles to adjust for environmentally-induced drift, while avoiding misinterpreting the effects induced by hovering hands as environmental changes. Such sensors are frequently employed in, for example, keyboards, keypads, touch-switches and other touch-sensitive input devices.

BACKGROUND

In capacitive sensor devices, a capacitor arrangement is created and structured so that circuitry attached to the capacitor plates can sense a change in capacitance Such a change can occur, for example, when one plate of the capacitor is pressed toward an opposite plate by an externally (directly or indirectly) applied touch force, or as a result of a human hand altering the electrical field of the capacitor through interaction with the fringing fields around the plates. Additionally, the presence of a human finger or similar object may be sensed even without an actual touching, when it is in close proximity to one plate of one or more capacitors, as the electrical field—and hence the capacitance—of the arrangement is altered by the presence of the finger or other object. The mere proximity of a portion of the human body, such as a finger, can create a sufficient variation in capacitance, without the need to apply pressure to a plate so as to move the plates closer together, to permit sensing of that condition.

Unfortunately, this sensitivity to approaching fingers is problematic. It is well known that capacitive sensors also are very sensitive to capacitance variability due to environmental changes, such as humidity, temperature, dirt, and so forth. A capacitive sensing system must, therefore, be able to distinguish reliably between capacitance changes that are due to environmental changes and capacitance changes that are due to an operator actually touching or approaching the sensor. It is undesirable to allow environmental changes to produce an output that could be interpreted as a touch or near touch. Conversely, it is also undesirable that a hand hovering in the vicinity of the sensor be interpreted as an environmental condition, for doing so may cause an environmental compensation process to change the sensitivity profile of the sensor and render it insensitive to an actual touch.

In the example of FIG. 1, there is shown diagrammatically the construction and operation of a capacitive sensor, for tutorial purposes. Reference will be made to this diagram in aid of explaining how environmental factors and a "hovering" hand can complicate the operation of such sensors, reducing their sensitivity and sometimes doing so to the point of rendering a sensor unresponsive to a user's touch. A differential construction is shown, with two capacitors 10A and 10B sharing one plate 12 in common, but it will be appreciated that single-ended designs may be substituted. Common plate 12 is connected to receive a transmit signal 14 on line 15 from a signal source (not shown). Opposing the common plate 12 are second and third plates 16A and 16B, each of which forms the second plate of a capacitor with common plate 12. In turn, these two plates 16A and 16B are connected, respectively, to the non-inverting and inverting inputs of a differential capacitance-to-digital converter (CDC), such as 18, having, for example, a 16-bit output. The plates (electrodes) 12 and 16 may typically be arranged so that a portion of the electric field between them, represented by lines 22, arcs into the region above or in front of the electrodes; most of the field, though, is directly between the electrodes, as indicated by field lines 24. When a user's hand approaches the electrodes, it resembles to the circuit, electrically speaking, a large "ground" mass, and reduces the field intensity between the transmitter and receiver electrodes 12, 16A and 16B, respectively. This alters the capacitance of the capacitor. The output value, or code, of CDC 18 is indicative of the close position of the ground mass (e.g., hand). Naturally, comparable single-ended arrangements are known, as well.

Now, referring to FIG. 2, assume that a user first presses down with a finger on the left-hand capacitor, which we will call sensor 16A, and then withdraws that finger and then puts it on the right-hand capacitor, which we will call sensor 16B. FIG. 2 shows the ideal output 30 of the CDC. Prior to the first sensor press, between sensor presses and after the second sensor press, the CDC output is stable at a fairly constant ambient value indicated within dotted rectangles 42. When the user's finger presses on sensor 16A, the output CDC value rises to a maximum output $CDC_{max}$ and when the user's finger is put on sensor 16B, the CDC output falls to a minimum value $CDC_{min}$. The output value of the CDC is read by a processor (not shown). Typically, the processor uses a first threshold value 48 to determine when the output of the CDC indicates that the first sensor has been pressed and a second threshold value 52 to indicate when the second sensor has been pressed. When a threshold is crossed, an interrupt is generated. Real-world operation, however, rarely produces such idealized operation. Rather, when the environment changes, the ambient value of the CDC output drifts. With stationary thresholds, this would be quite problematic, as illustrated by the CDC value waveform 30' in FIG. 3. There, ambient drift is indicated in the changes in ambient levels of waveform 30' from 54 to 56 to 58. As a consequence, though a finger on sensor A is still detected (i.e., threshold 48 is crossed), a finger on sensor B does not cause the CDC output value to cross the threshold 52, so no interrupt is generated and the processor never detects that the second sensor was pressed.

This problem can be overcome if the ambient value of the CDC output changes due only to environmental factors and the threshold values can be made to change with changes in the ambient CDC output. (The "ambient" value of the CDC output to be tracked is the background value of the CDC output with all human hands kept distant so as not to touch the sensors. This ambient value is calculated from the CDC output when the user is not close to or touching a sensor.) More particularly, it would be desired that the threshold values remain at equal distance from the (moving) ambient value while tracking or calibrating for environmental changes, but this ideal often is not achieved. FIG. 4 shows at 62 and 64 the situation that would result with the threshold values 48 and 52 changing to track the ambient drift. That is, both sensor presses generate interrupts.

While various techniques exist to compensate for ambient drift in capacitive sensing arrangements, these approaches have not proven to be ideal and, indeed, some will still permit environmentally-induced drift to allow input devices to become temporarily insensitive to touch. For example, with some systems, if a user's finger hovers in the vicinity of a key or input button, but does not press the key or button, the hovering presence of the user's body is interpreted as a sign of drift that requires compensation, and the resulting over-compensation may render the key or button actually insensitive to touch for a period of time.

SUMMARY

Improved capacitive sensor operation is achieved with improved discrimination between environmental drift and apparent drift attributable to human proximity to the sensor. A proximity algorithm detects conditions which are interpreted as indicating a user is close to, but not touching, a sensor. When such proximity is detected, ambient value calibration is halted, thereby avoiding treating the human's proximity as environmental drift requiring compensation and preventing miscalculation of calibration. The proximity algorithm employs two moving average filters to monitor the CDC output values over time and to make appropriate adjustments to a signal representing the ambient, while distinguishing environmental draft from proximity induced pseudo-drift.

Both the methods employing the proximity algorithm and apparatus embodying capacitance sensor signal processing are included as aspects of the invention.

According to a first aspect, a method of operating a capacitive sensor assembly having at least one capacitive sensor element and a capacitance-to-digital converter (CDC) that supplies output codes corresponding to sensor element capacitance, comprises acts of determining an ambient value of the CDC output codes; modifying at least one threshold value in response to changes in said ambient value; and detecting proximity of a ground mass to the sensor element and preventing the modification of threshold values while said proximity is detected. The ground mass may be a portion of a human body, such as a hand or finger. Such method may further comprise generating an output signal indicating when a CDC output code exceeds in magnitude a respective threshold value.

According to another aspect, a method of operating a capacitive sensor assembly having at least one capacitive sensor element and a capacitance-to-digital converter (CDC) that supplies output codes corresponding to sensor element capacitance, comprises using a proximity algorithm to detect conditions which are interpreted as indicating a user is close to, but not touching, a sensor element and then halting ambient value calibration while said condition or conditions persist. The proximity algorithm may employ two moving average filters to monitor the CDC output values over time and to make appropriate adjustments to a signal representing the ambient, while distinguishing environmental draft from proximity induced pseudo-drift. For example, said filters may comprise a Fast Filter and a Slow Filter, the Fast Filter input receiving the CDC output values and averaging a predetermined number of CDC output values to produce a sequence of Fast Filter Average values; the Slow Filter input receiving the Fast Filter Average values and generating a new output value only if proximity of a ground mass is not detected and the CDC output values are changing slowly.

According to another aspect, a method is provided of operating a capacitive sensor assembly comprising at least one capacitive sensor element and a capacitance-to-digital converter (CDC) that supplies output codes corresponding to sensor element capacitance. The method comprises acts of determining an ambient value of the CDC output codes; modifying at least one threshold value in response to changes in said ambient value; and detecting proximity of a ground mass to the sensor element and preventing the modification of threshold values while said proximity is detected. The ground mass may be a portion of a human body. Such method may further comprise generating an output signal indicating when a CDC output code exceeds in magnitude a respective threshold value. In such a method, modifying at least one threshold value may comprise modifying said threshold in dependence on a sensitivity setting to vary an amount of pressure required to signal a valid touch on the sensor element. The threshold may be modified, moreover, in dependence on a combination of a sensitivity setting and a history of CDC code variation. Modifying at least one threshold value may further comprise modifying said threshold in dependence on an offset value. Modifying at least one threshold value also may further comprise employing ambient, maximum CDC value and minimum CDC value as well as a sensitivity setting to provide a threshold that adapts sensor response to external conditions. The external conditions may include one or more of an environmental condition and a user's finger size.

According to a further aspect, a method is provided of operating a capacitive sensor assembly comprising at least one capacitive sensor element and a capacitance-to-digital converter (CDC) that supplies output codes corresponding to sensor element capacitance. Such method comprises using a proximity algorithm to detect conditions which are interpreted as indicating a user is close to, but not touching, a sensor element and then halting ambient value calibration while said condition or conditions persist. Said proximity algorithm may employ two or more moving average filters to monitor the CDC output values over time and to make appropriate adjustments to a signal representing the ambient CDC output value, while distinguishing environmental draft from proximity induced pseudo-drift. Said filters may comprise, for example, a Fast Filter and a Slow Filter, the Fast Filter receiving the CDC output values and averaging a predetermined number of CDC output values to produce a sequence of Fast Filter Average values; the Slow Filter receiving the Fast Filter Average values and generating a new output value only if proximity of a ground mass is not detected and the CDC output values are changing slowly.

According to another aspect, there is shown a method of operating a capacitive sensor assembly having at least one capacitive sensor element and a capacitance-to-digital converter (CDC) that supplies output codes corresponding to sensor element capacitance. Such method comprises performing an ambient value calibration of the CDC output; using a proximity algorithm, processing the CDC output to detect a condition or conditions interpreted as indicating a user is close to, but not touching, a sensor element; and halting ambient value calibration of the CDC output when the proximity algorithm indicates said condition or conditions persist; where the proximity algorithm employs first and second moving average filters to monitor the CDC output values over time and to detect said condition or conditions. The first and second filters may comprise, respectively, a fast filter and a slow filter, the fast filter receiving the CDC output values and averaging a predetermined number of CDC output values to produce a sequence of Fast Filter Average values; the Slow Filter receiving the Fast Filter Average values and generating a new output value only if proximity of a ground mass is not detected and the CDC output values are changing relatively slowly.

According to a still further aspect, there is presented a method of operating a capacitive sensor assembly having at least one capacitive sensor element and a capacitance-to-digital converter (CDC) that supplies output codes corresponding to sensor element capacitance, comprising using a multi-step proximity algorithm, detecting from output of the CDC a condition or conditions indicative of a user being close to, but not touching, a sensor element; and halting ambient value calibration of the sensor assembly while said condition or conditions persist; wherein the proximity algorithm employs at least a first step and a second step and said first step and said second step apply different criteria directly or indirectly to the CDC output, to distinguish environmental drift from proximity induced pseudo-drift. The different criteria may include different averaging of CDC output values.

According to yet another aspect, a calibration assembly is shown for use with a capacitive sensor assembly having at least one capacitive sensor element and a capacitance-to-digital converter (CDC) that supplies output codes corresponding to sensor element capacitance, comprising a processor executing one or more sequences of program instructions to: determine an ambient value of the CDC output codes; modify at least one threshold value in response to changes in said ambient value; and detect proximity of a ground mass to the sensor element and prevent the modification of threshold values while said proximity is detected. The processor may further execute instructions to generate an output signal indicating when a CDC output code exceeds in magnitude a respective threshold value. Modifying at least one threshold value may comprise modifying said threshold in dependence on a sensitivity setting to vary an amount of pressure required to signal a valid touch on the sensor element. Modifying at least one threshold value may further comprise modifying said threshold in dependence on an offset value.

A still further aspect is a calibration assembly for use with a capacitive sensor assembly having at least one capacitive sensor element and a capacitance-to-digital converter (CDC) that supplies output codes corresponding to sensor element capacitance, comprising a processor executing instructions to perform a proximity algorithm to detect conditions which are interpreted as indicating a user is close to, but not touching, a sensor element and then halting ambient value calibration while said condition or conditions persist. The proximity algorithm may employ two (or more) moving average filters to monitor the CDC output values over time and to generate corresponding adjustments to a signal representing the ambient CDC output value, while distinguishing environmental draft from proximity induced pseudo-drift. Such moving average filters may comprise a Fast Filter and a Slow Filter, the Fast Filter input receiving the CDC output values and averaging a predetermined number of CDC output values to produce a sequence of Fast Filter Average values; the Slow Filter input receiving a plurality of the Fast Filter Average values and generating a new output value only if proximity of a ground mass is not detected and the CDC output values are changing relatively slowly.

According to yet another aspect, a calibration assembly is provided for a capacitive sensor assembly having at least one capacitive sensor element and a capacitance-to-digital converter (CDC) that supplies output codes corresponding to sensor element capacitance. Said assembly comprises a processor executing instructions to: perform an ambient value calibration of the CDC output; use a proximity algorithm to processing the CDC output to detect a condition or conditions indicating a user is close to, but not touching, a sensor element; and halt ambient value calibration of the CDC output when the proximity algorithm indicates said condition or conditions persist; the proximity algorithm employing first and second moving average filters to monitor the CDC output values over time and to detect said condition or conditions. The first and second filters may comprise, respectively, a fast filter and a slow filter, the fast filter receiving the CDC output values and averaging a predetermined number of CDC output values to produce a sequence of Fast Filter Average values; the Slow Filter receiving the Fast Filter Average values and generating a new output value only if proximity of a ground mass is not detected and the CDC output values are changing relatively slowly.

According to one more aspect, a calibration assembly for a capacitive sensor assembly having at least one capacitive sensor element and a capacitance-to-digital converter (CDC) that supplies output codes corresponding to sensor element capacitance comprises a processor adapted to: use a multi-step proximity algorithm to detect from output of the CDC a condition or conditions indicative of a user being close to, but not touching, a sensor element; and halt ambient value calibration of the sensor assembly while said condition or conditions persist; wherein the proximity algorithm employs at least a first step and a second step and said first step and said second step apply different criteria directly or indirectly to the CDC output, to distinguish environmental drift from proximity-induced pseudo-drift. The different criteria may include different averaging of CDC output values. The different criteria also may include at least two different methods to distinguish environmental drift from proximity-induced pseudo-drift.

Further, elements of these aspects may be combined in ways not expressly illustrated, but which will be apparent to those skilled in the art.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 7A-7D together are a diagrammatic illustration of an adaptive threshold determination algorithm for providing environmental compensation and distinguishing pseudo drift from environmental drift;

DETAILED DESCRIPTION

Figure 1:
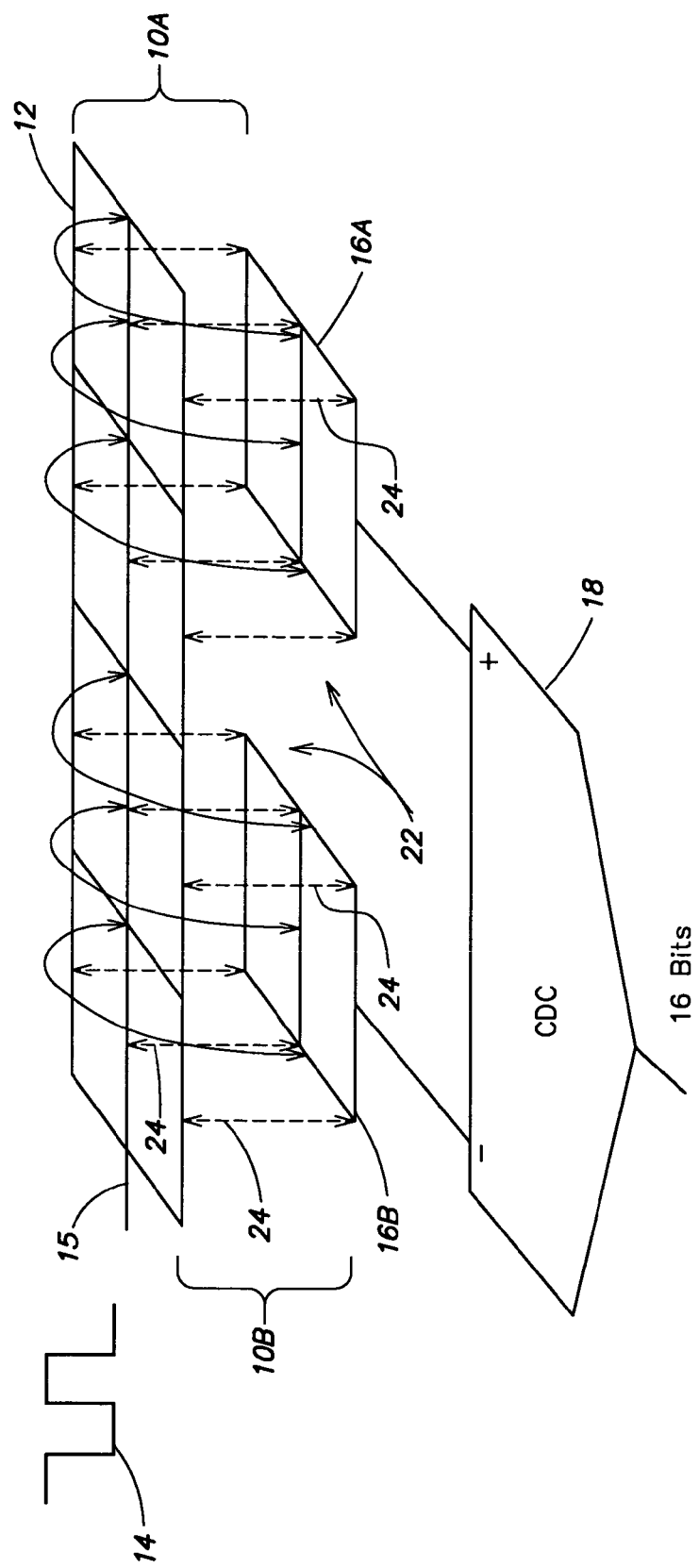
FIG. 1 is a diagrammatic illustration of a capacitive sensor architecture according to the prior art.
Figure 2:
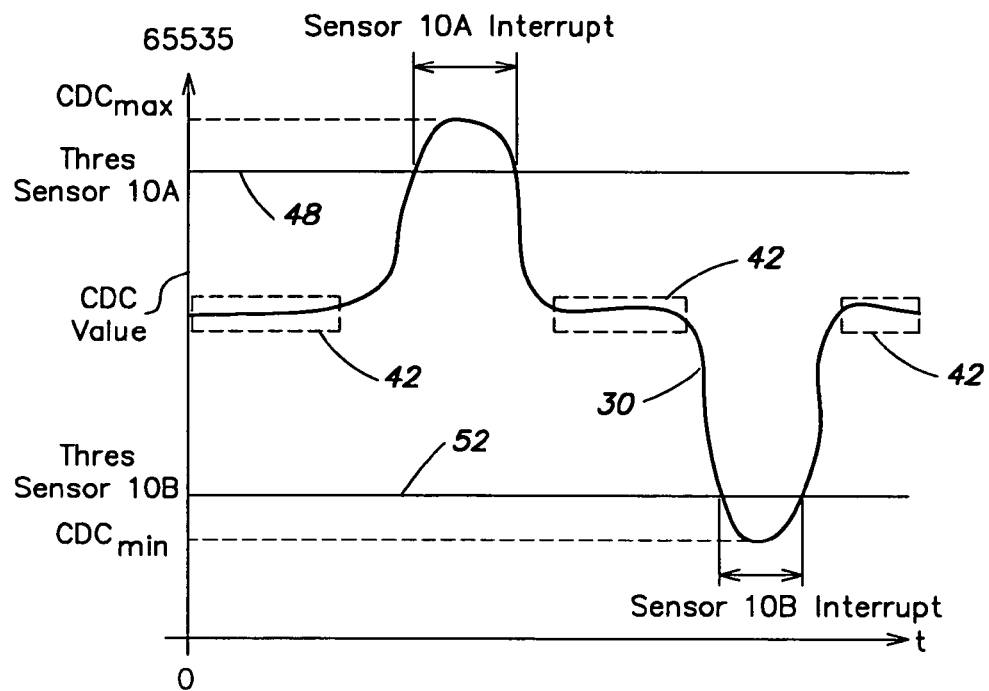
FIG. 2 is a waveform corresponding to the architecture of FIG. 1, showing how a CDC output and processor interrupt are generated in relation to the sensors being touched, for stable ambient conditions.
Figure 3:
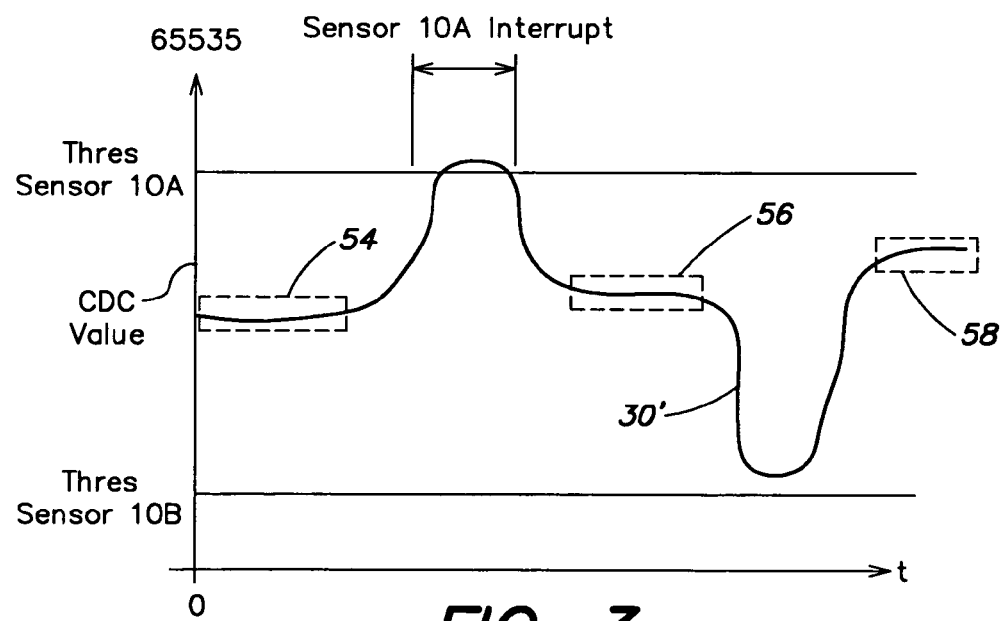
FIG. 3 is a waveform like FIG. 2, but showing how ambient drift can cause the sensor to become unresponsive.
Figure 4:
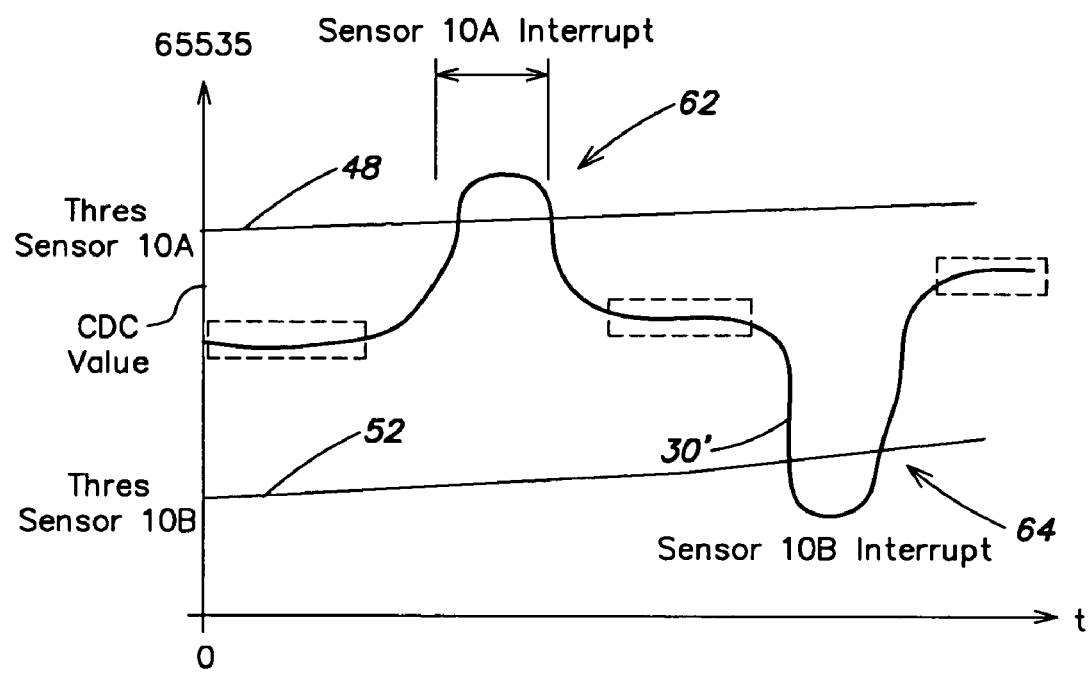
FIG. 4 is a waveform showing how the sensor responsiveness may be compensated, in theory, for ambient drift.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Figure 5A:
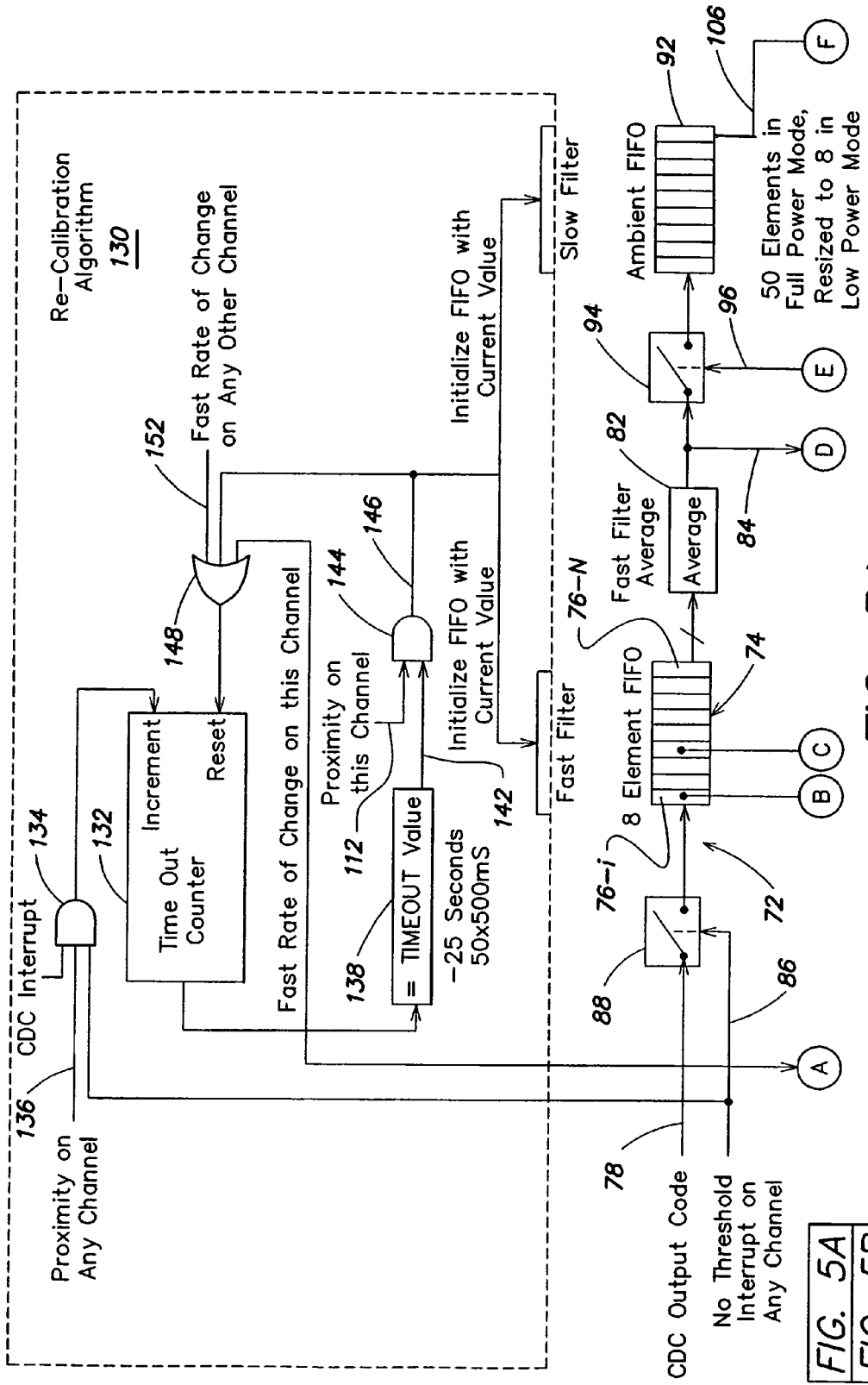
FIGS. 5A and 5B together are a simplified block diagram of a proximity detection and ambient calculation aspect of an environmental calibration algorithm as presented herein.
Figure 5B:
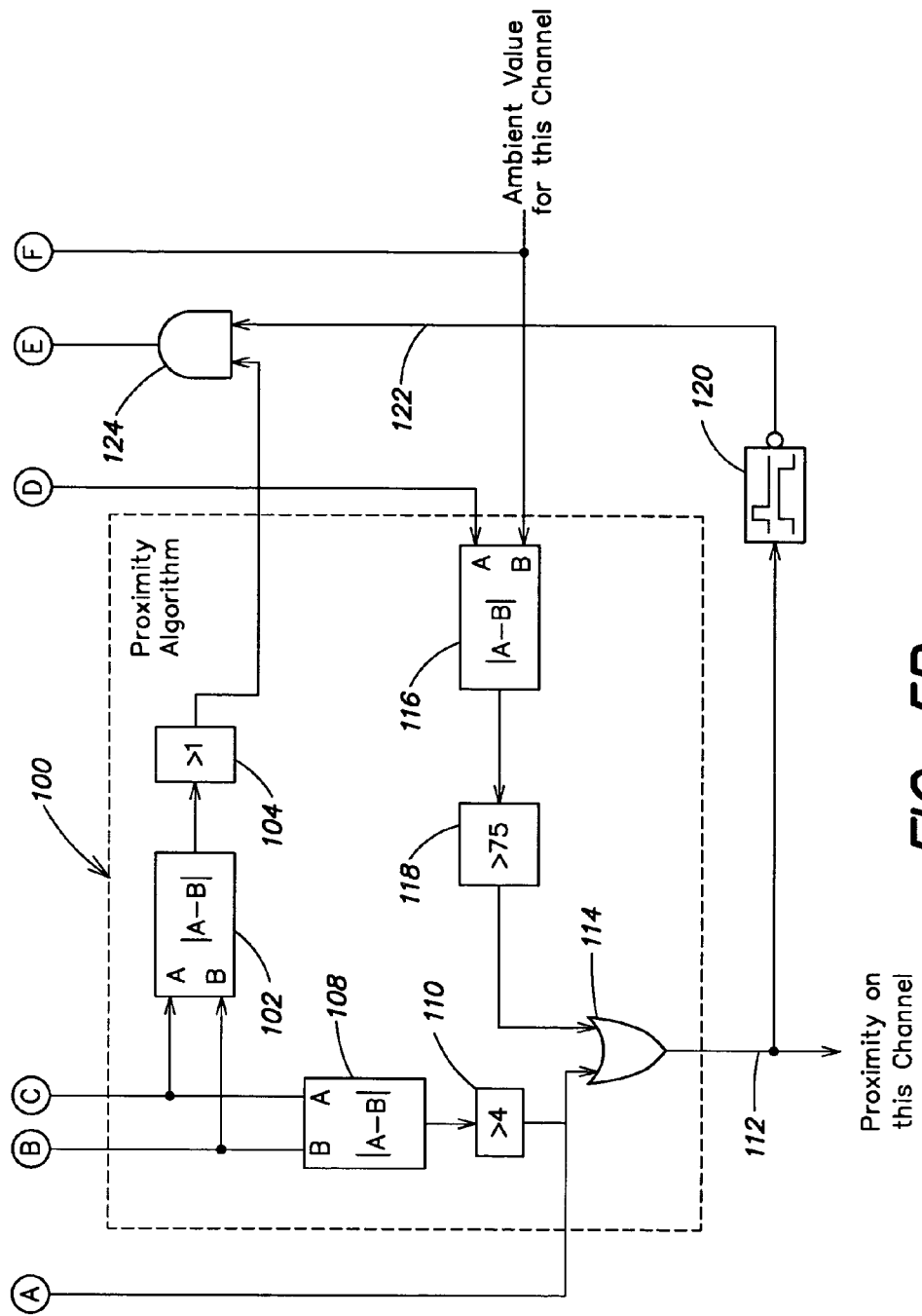

As more fully described below, an environmental calibration algorithm as provided herein (and a sensor assembly employing such an algorithm) uses two moving average filters, called the Fast Filter and the Slow Filter, respectively, to monitor CDC output values over time and to generate or calculate upper and lower threshold values, UT and LT, respectively. The UT and LT values are managed for both environmentally-induced drift and proximity-induced "pseudo drift" due to a hovering hand or similar object. These filters will be explained with reference to a simplified block diagram in FIGS. 5A-5B, though it will be understood that this block diagram (or its operation) has an equivalent flow chart representation and, thus, the filters may readily be implemented in corresponding software code. That is, although FIGS. 5A,B may be construed by some as a hardware implementation, it is meant rather as a disclosure of operation, however that operation should be embodied. Indeed, the filters are conceived as commonly implemented in software executed by a programmable processor, such as a microprocessor, or in an ASIC (application-specific integrated circuit). (References to a "processor" shall be understood to refer to any kind of information processor, analog or digital, notwithstanding any reference to programs or instructions.) Thus, each or any block in the block diagram might be implemented as a block of program code rather than as physically instantiated circuitry comprising switches, comparators and the like. Each physical circuit or circuit element that is illustrated has one or more well-known software counterparts, and others that can be created by those skilled in the art. Of course, the processing could be embodied in some other genre of processor element, as well. The invention is not limited to a specific kind of implementation.

Each of the two moving average filters produces an average value, though they are two different average values, of course. In some implementations, one or each average is formed as the sum of all values of CDC samples in a register of a described predetermined length, divided by the length of the register (i.e., the number of samples or stages or register elements contained in the register). The registers are preferably first-in, first-out (FIFO) registers.

The Fast Filter, indicated generally at 72, employs an N-stage FIFO register 74. N, the number of stages, is relatively small, such as 8 (each stage or element being indicated as one of the constituent rectangles 76-$i$). Register 74 is updated at frequent intervals (such as once every 38 ms when operating in full power mode, in an example of an implementation per the AD7142 CDC from Analog Devices, Inc., Norwood, Mass.); the time interval is typically selected as a tradeoff between the required smooth, speedy response of the man-machine interface and power consumption, with <50 ms response time being generally acceptable as imperceptible to a typical user. The Fast Filter input receives the CDC output on line 78, so the values in the register elements are successive CDC output values. The values in all of the register elements 76-$i$ are averaged in averaging stage 82 to produce a Fast Filter Average result on line 84, which is a moving average value updated with each new CDC code received.

A suitable mechanism (a number will readily occur to an engineer), not shown, generates a signal on line 86 to control a switch 88. The signal on line 86 indicates whether, for a new CDC code value, an interrupt has been generated, indicative of a threshold having been crossed. If there is no threshold interrupt for any CDC output (i.e., taking into account that there may be multiple keypad entry buttons or other sensors), the signal on line 86 is asserted and switch 88 is closed, supplying a new CDC output sample to register 74.

By contrast, the Slow Filter is based on a second FIFO register 92 which is much longer, for example 50 elements, and receives as input not the CDC output but, rather, the Fast Filter Average results. The Slow Filter preferably is updated (i.e., receives a new input sample and generates a new output value) only if proximity (e.g., of a hand) is not detected and the CDC output values are changing slowly. Such operation is indicated by the inclusion of switch 94, which selectively connects the Fast Filter Average signal to the input of register 92 in response to a signal on line 96. The signal on line 96 is controlled by the proximity algorithm described above. Such algorithm is shown as implemented at block 100.

For example, the Slow Filter may be updated only if there is a difference of greater than one CDC code level between two non-consecutive elements (e.g., the $N^{th}$ and $N-4^{th}$ elements) of the Fast Filter FIFO 74. This is indicated by the differencing device 102 and value comparator 104. This last condition prevents the Slow Filter from catching up with the Fast Filter too quickly.

The Slow Filter is used mostly as a buffer. There are various ways to calculate a slow average. For example, a mid-point element of the Slow Filter, indicated at line 106, may be used as the calibrated ambient value. Or the last element or another element may be used.

However, it is also possible to average the contents of the Slow Filter (in much the same manner as the Fast Filter) to provide the required ambient value. It has been found that the former method is preferred, but it should be clear the there are almost limitless different ways to filter a stream of numbers to arrive at an average.

Using this approach, the Fast Filter tracks the output of the CDC and the Slow Filter lags behind it.

If the user has not touched the sensor for a predetermined period of time, the system may optionally (but often preferably) be placed in a low power mode (not illustrated). In such a mode, the CDC output updates the Fast Filter much more slowly, such as once every 500 mS. Also, in low power mode, the Slow Filter may be re-sized to fewer elements, such as 8 elements, as in the Fast Filter, so as to keep the overall time for which CDC results are looked at and averaged approximately the same despite having fewer updates.

As previously stated, a proximity detection algorithm 100 is used to prevent calibration when a user's hand is "hovering" near, but not pressing on, a capacitor (e.g., a key or button). In an exemplary embodiment, there are two cases under which such a proximity condition is deemed to occur and a corresponding Proximity signal is asserted. First, the Fast Filter is used as a differentiator to detect a rate of change in the CDC output results. A difference is found by block 108 between two elements of the Fast Filter FIFO, such as the $N^{th}$ element and the $N-4^{th}$ element. If this difference exceeds some predetermined number, indicated as 4 in block 110, a signal called the Proximity signal is asserted on line 112 via OR-gate 114. This processing detects a user approaching the sensor or moving away from the sensor. Second, the Proximity signal is asserted if there is detected a difference of a substantial number of codes, such as (for example) 75 codes (using elements 116 and 118, for example), between the Fast Filter Average signal value and the ambient value. This is to insure that calibration does not occur if the user hovers over or very slowly approaches the sensor.

Once proximity is detected by either of these two conditions and the Proximity signal is asserted, a timer 120 prevents calibration from occurring for a predetermined period of time, such as 5 seconds, such as by de-asserting input 122 to AND gate 124. The actual mechanism for implementing the timer to prevent calibration during that interval will depend on the specific signal processing implementation which has been selected, and an appropriate timer mechanism will readily occur to those skilled in the art. For example, in a software implementation, a wait loop may be employed, while in a hardware implementation one might simply gate the clock inputs of the registers with a signal from a one-shot multivibrator.

As a precaution, the Proximity signal may be reset and deasserted if it has been asserted for a long time—e.g., more than 20 seconds—and a valid touch interrupt has not occurred. This is called re-calibration and in the illustrated example is carried out by Re-Calibration Algorithm 130.

In Re-Calibration Algorithm 130, a time out counter 132 is incremented by three-input AND gate 134 when (a) there is no threshold interrupt signal on line 86, (b) a signal is asserted on line 136 (which occurs when the Proximity signal is asserted for at least one channel) and (c) a CDC interrupt signal is received for at least one channel. (Note that the use of the term "channel" refers to the situation wherein multiple sensors are arranged on a keypad or the like. Each sensor's CDC output is processed as shown herein and the processing of each CDC output is done by a separate "channel." Thus, it is useful, though not always necessary, to treat all of the sensors alike for calibration purposes, since they are subject to the same environmental conditions and substantially the same user proximity. So, a detection of proximity on any one channel may, as illustrated, be treated the same as detection of proximity in a subject channel.) Logic 138 evaluates the output of time out counter 132 and asserts an output signal (the TIME OUT signal) on line 142 to AND gate 144 when the time out counter reaches a predetermined count, the TIME OUT value (typically representing, e.g., about 20-25 seconds). When the TIME OUT signal is asserted as well as the Proximity signal for the channel (on line 112), AND gate 144 asserts an output on line 146. In turn, this initializes registers 74 and 92 with the then-current CDC value. Counter 132 is reset by OR gate 148 when (a) block 110 asserts an output indicating a rapid rate of change, or (b) AND gate 144 asserts an output, or (c) the block 110 for some other channel (sensor) asserts a signal on line 152.

Where the device includes multiple sensors, such as a device that would have a numeric keyboard, each key or button of which has its own sensor, or where the keystroke is deduced from a matrix of sensors (potentially minimizing the number of sensors, as known in the art), the re-calibration algorithm used to reset the registers 74 and 92 (and, thus, the Proximity signal) may be common to all or a group of the keys, to reduce hardware or processing requirements.

Thus, if the Proximity signal is asserted for any key and no valid touch interrupt has occurred, the timer is started and it increments on each interrupt after a new CDC conversion. Three non-limiting ways are presented for resetting this timer. First, as noted above, the Fast Filter stage can be used as a differentiator to detect a rate of change in the CDC output results greater than a predetermined threshold value. For example, if there is a difference greater than a predetermined threshold, such as 4, between two elements (e.g., the $N^{th}$ element and the N-$4^{th}$ element) of the Fast Filter FIFO, then the timer can be reset, as this condition indicates a user approaching the sensor during the re-calibration period. Second, the timer can be reset when such a rate of change is detected for any other key or when the timer reaches a time out value. In turn, the TIME OUT value depends on the CDC update rate. Typically, it may be set to give an approximate time out of 25 seconds in the 500 mS update rate mode. Third, once the timer 132 reaches the TIME OUT value and the Proximity signal is reset for that particular key (channel), the Fast and Slow Filters are initialized with the then-current CDC value, to clear the Proximity signal for that channel and reset the timer. The Fast Filter Average result and the ambient value are recalculated on the next CDC interrupt. Alternatively, they can be initialized to the current CDC value at the same time as the Fast and Slow Filters.

The re-calibration algorithm allows for a graceful recovery from an error condition which has caused proximity to be asserted for too long. As described above, if Proximity is set for too long (but the threshold is not exceeded), such as due to some unusual finger hovering scenario combined with substantial environmental change, then this could start to become an issue because during a proximity event (i.e., when the Proximity signal is asserted), analysis of environmental changes is suspended. Generally, the two-step proximity/ threshold combination works well. But if a false Proximity signal is somehow asserted, it is important that there be some mechanism to automatically exit or terminate this condition after some time. The re-calibration algorithm is thus complementary to the core proximity algorithm.

In the wider sense, there may be other situations (known in the art) where recalibration is necessary, such as to recover from error conditions. The algorithm(s) shown herein is designed to be complimentary to these methods.

Adaptive Threshold Algorithm

So far, there has been no explanation as to how to adapt CDC processing to compensate for drift in the ambient level while screening out pseudo-drift. With a calibrated ambient level, however, the threshold levels can be made to adaptively track the ambient value (i.e., above and below). In the case of differential sensors, these thresholds can be placed on either "side" of the ambient value. A valid touch is then detected when the upper or lower threshold is exceeded by the current CDC value.

At the start of an exemplary threshold adaptation algorithm, the threshold or thresholds are initialized with a starting value found during characterization of the sensor. For example, assuming there is to be an upper threshold (UT) and a lower threshold (LT), the upper threshold initial value may be set to about the mid-point between the ambient value and the expected maximum (Max) sensor value, and the lower threshold may be set approximately midway between the ambient value and the expected minimum (Min) sensor value. The expected Max and Min average values preferably are initialized with starting values which may be based on a priori characterization of a sensor. These Max and Min average values and the upper and lower threshold values then self-learn and adapt as the user touches the sensor. Thus, over time, the adaptation algorithm improves the accuracy of those values.

The Max and Min average values preferably are updated as a function of how much pressure a user applies when touching the sensor.

Figure 6:
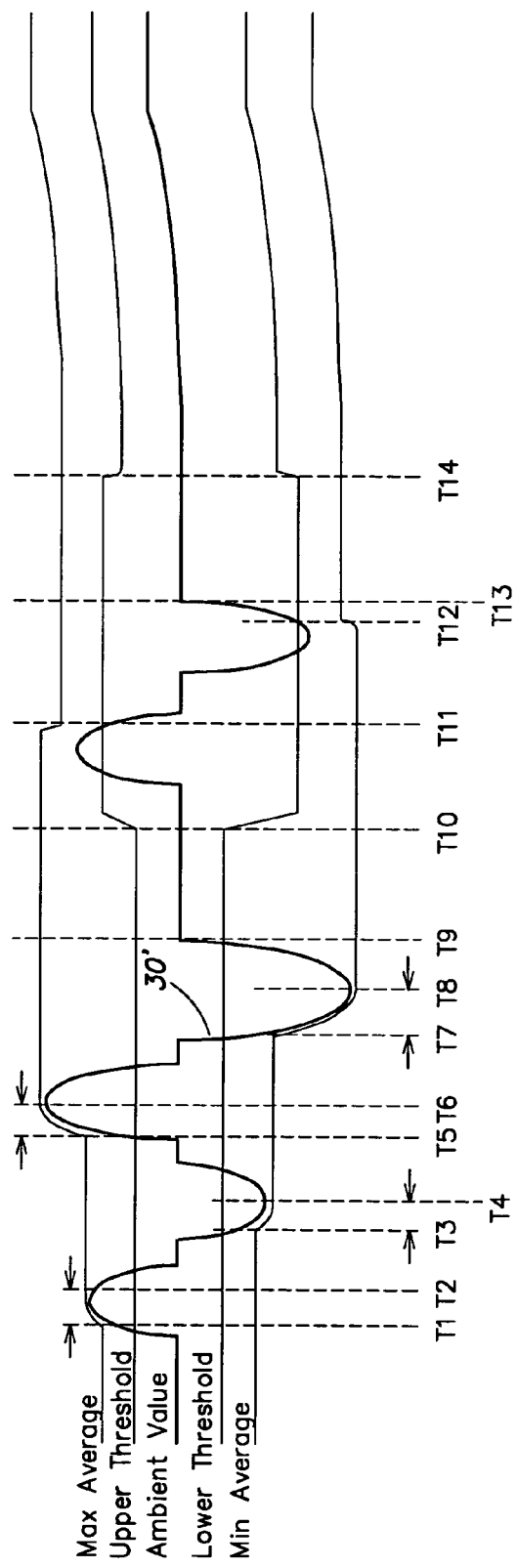
FIG. 6 is a plot illustrating how the thresholds are adjusted, with the algorithm of FIGS. 5A, 5B, according to changes in the ambient value and the Max and Min sensor values.
Figure 7B:
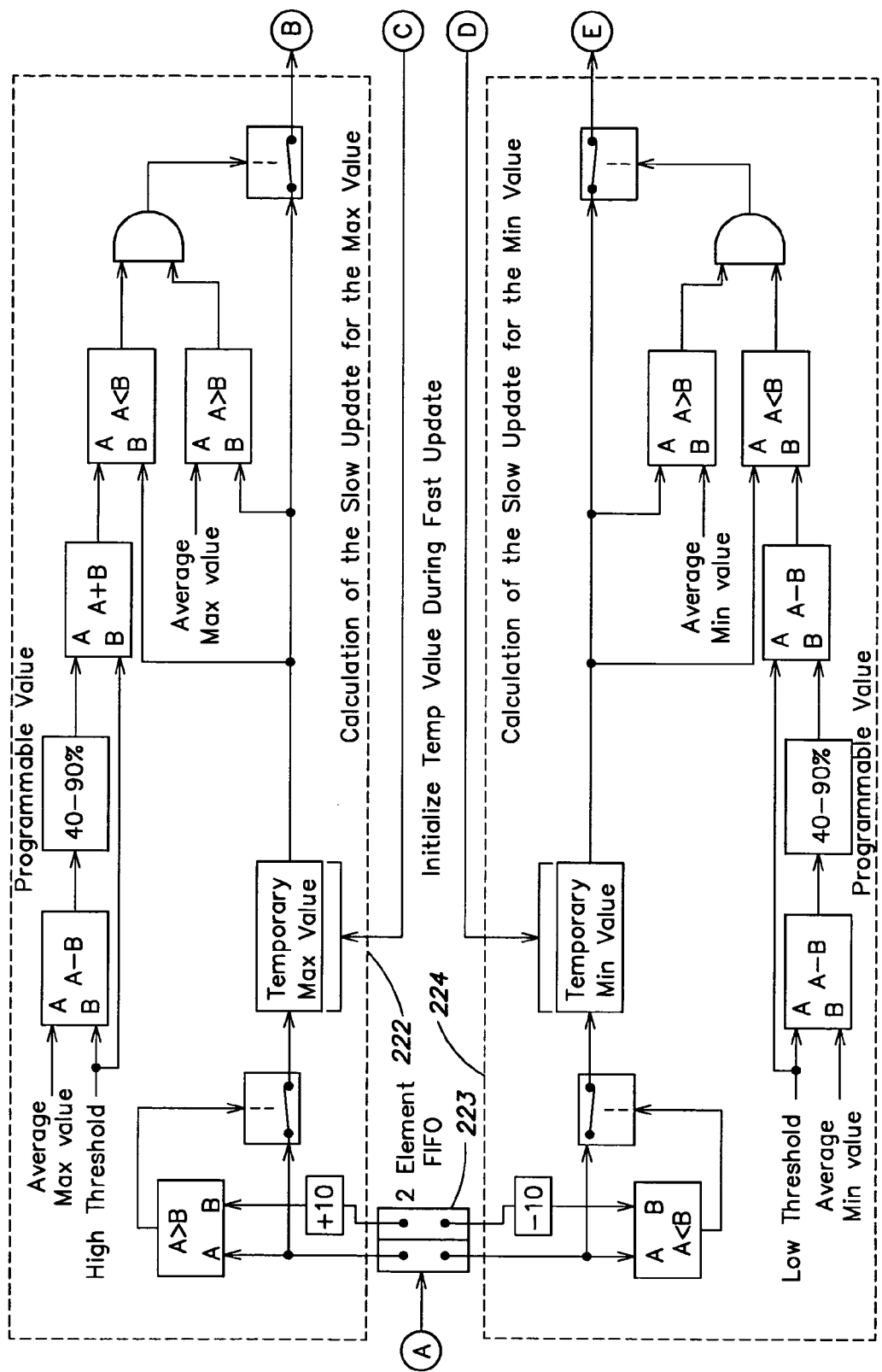
Figure 7C:
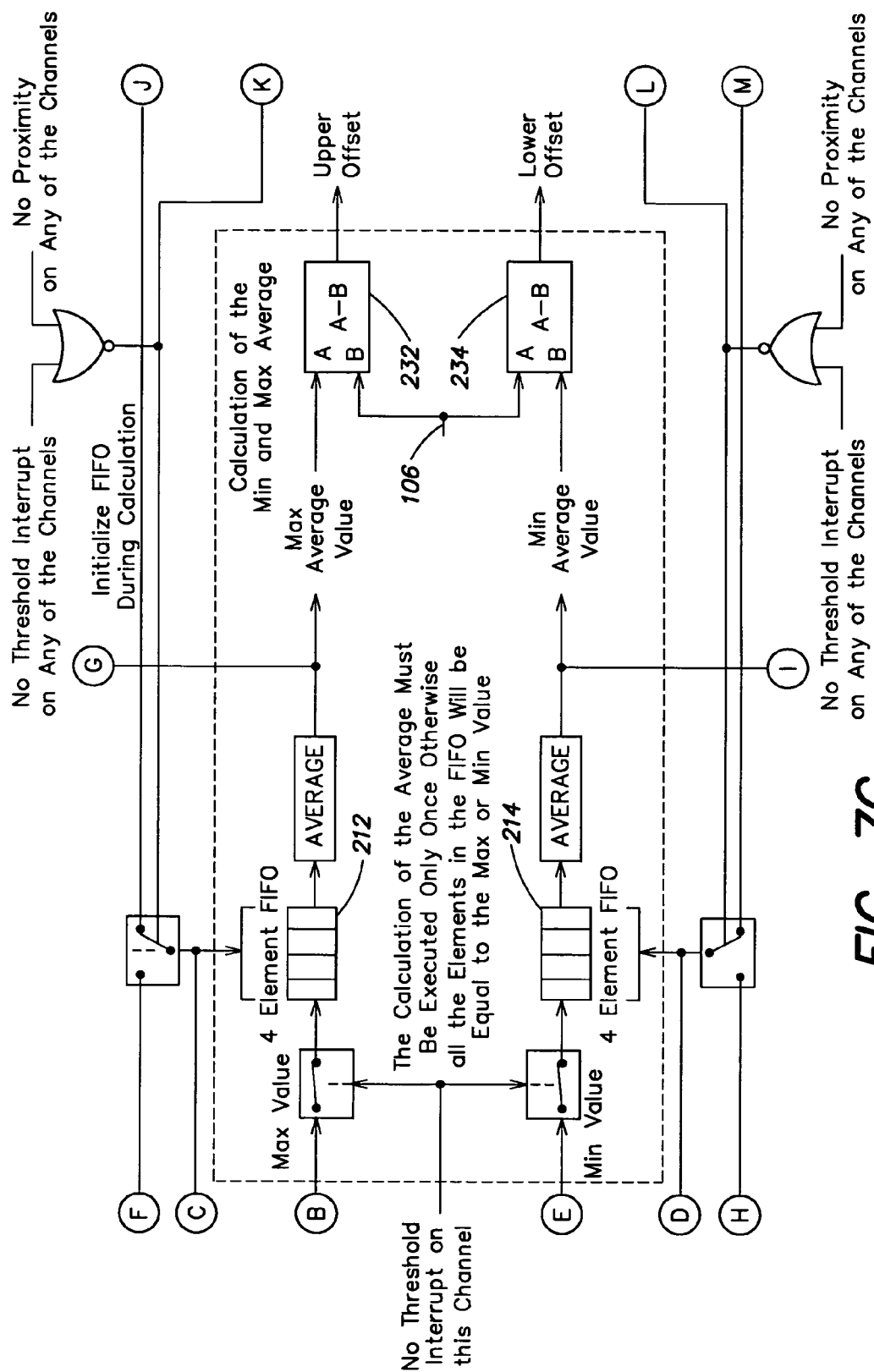
Figure 7D:
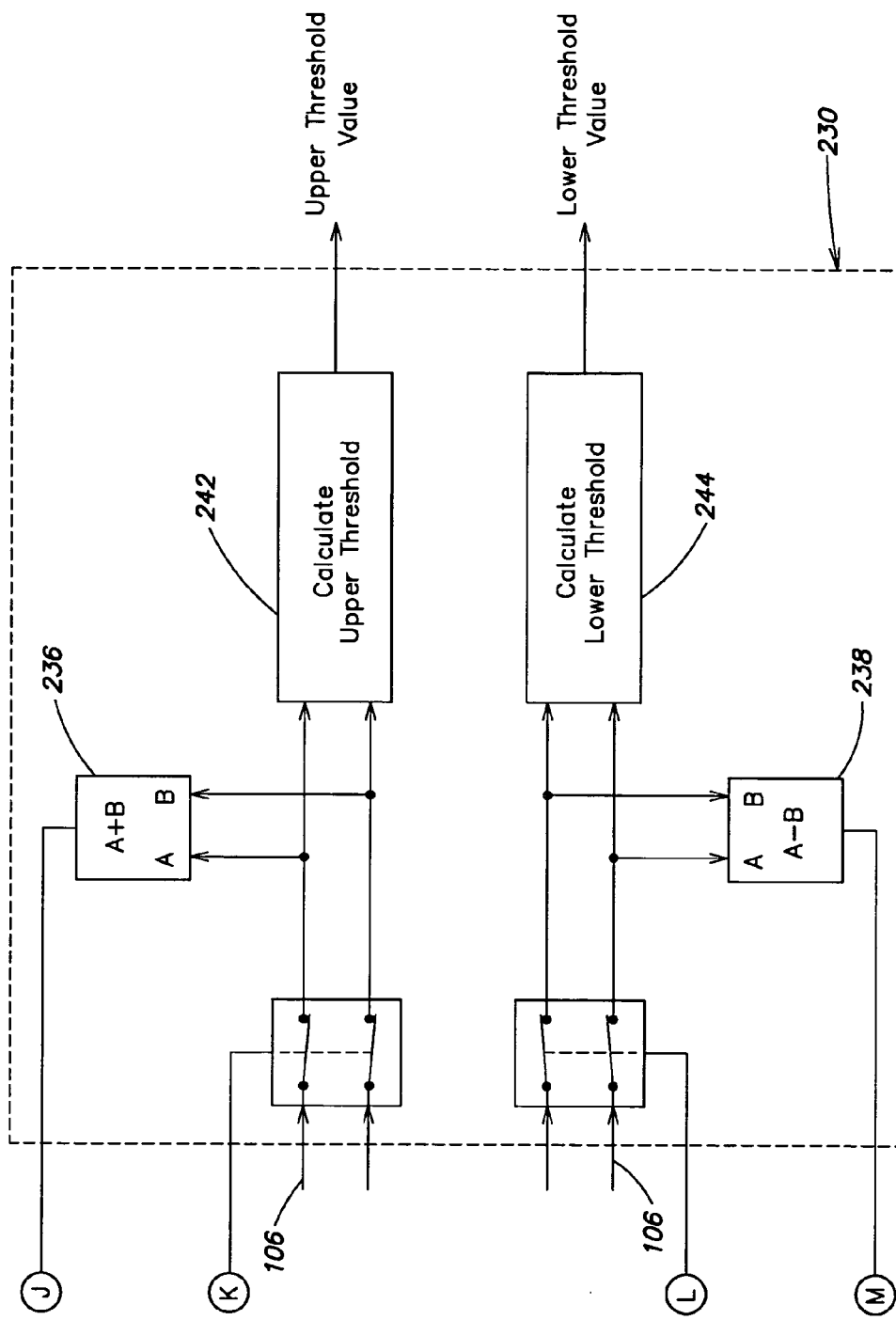
Figure 8A:
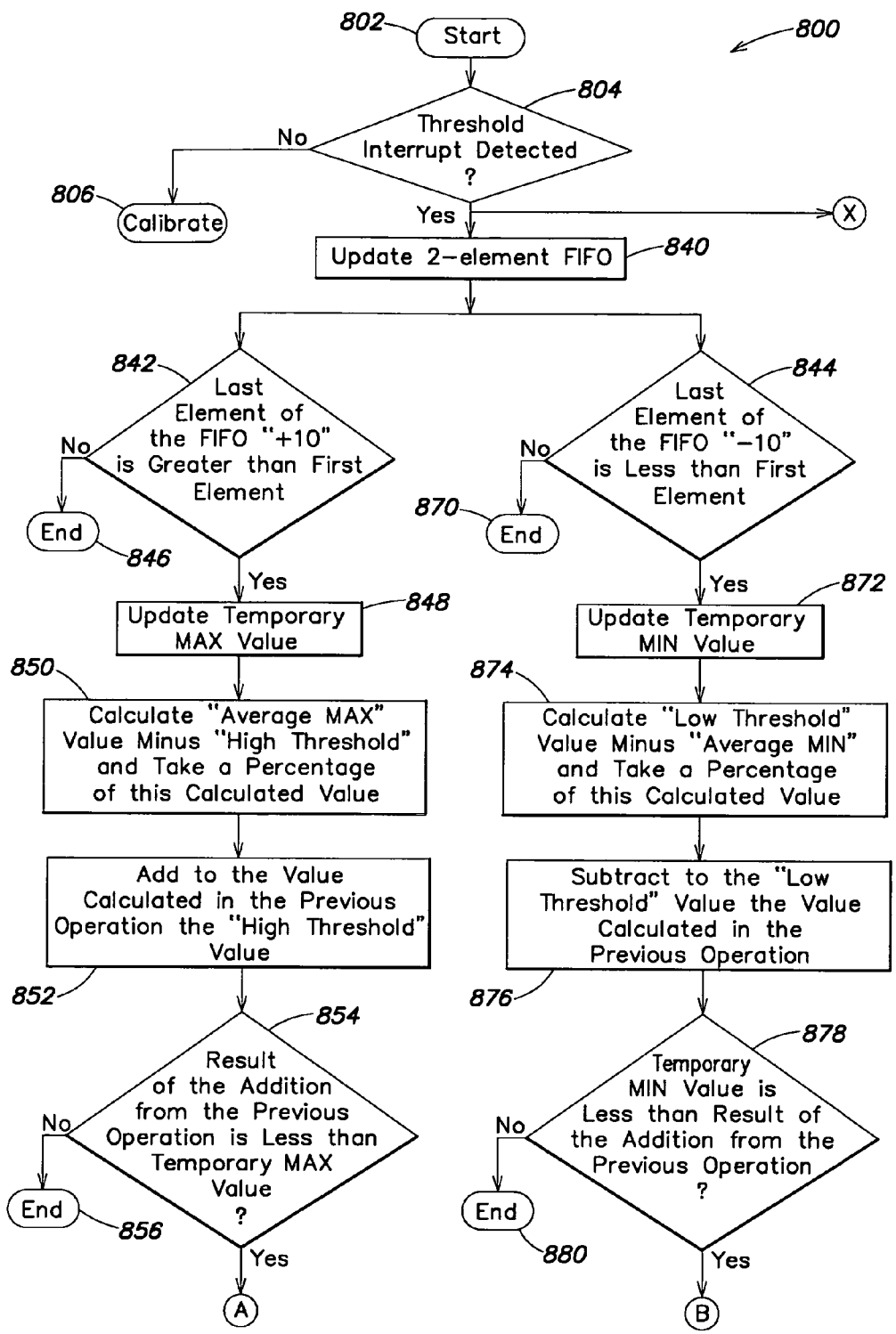
FIGS. 8A-8D collectively comprise a flow chart depicting an operational flow of an example of a computer program or other implementation of the algorithm of FIG. 7 (i.e., FIGS. 7A-7D)
Figure 8B:
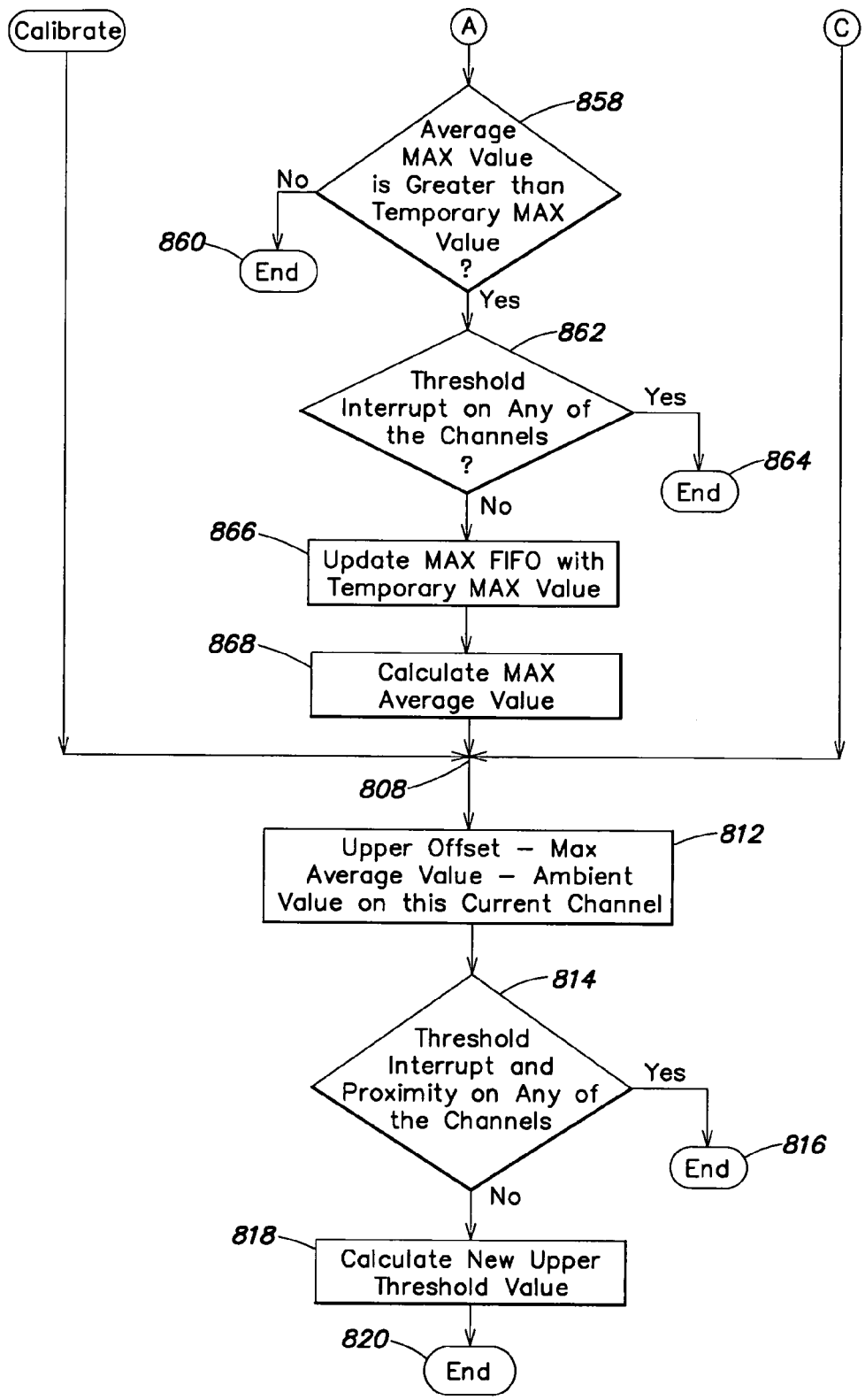
Figure 8C:
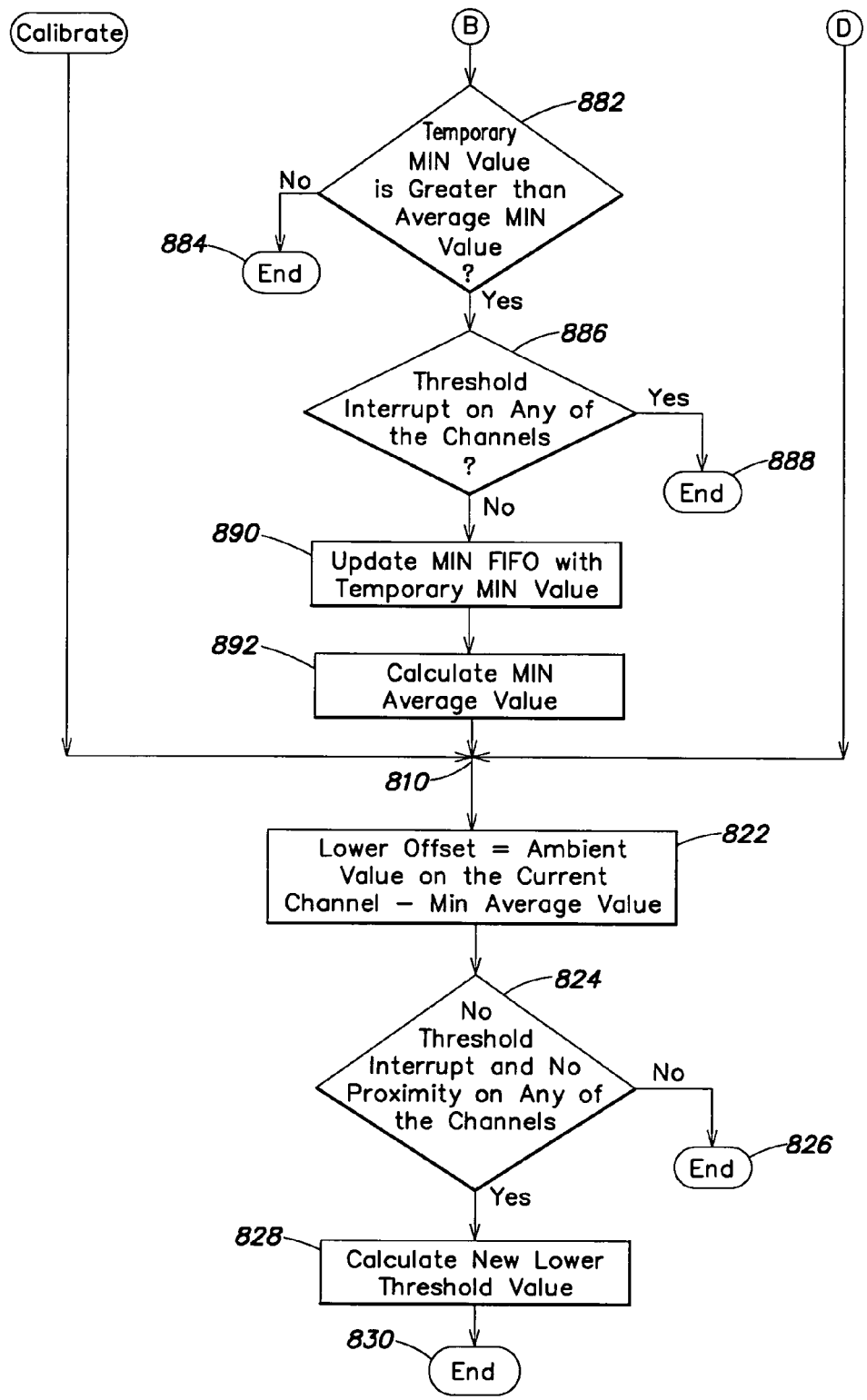
Figure 8D:
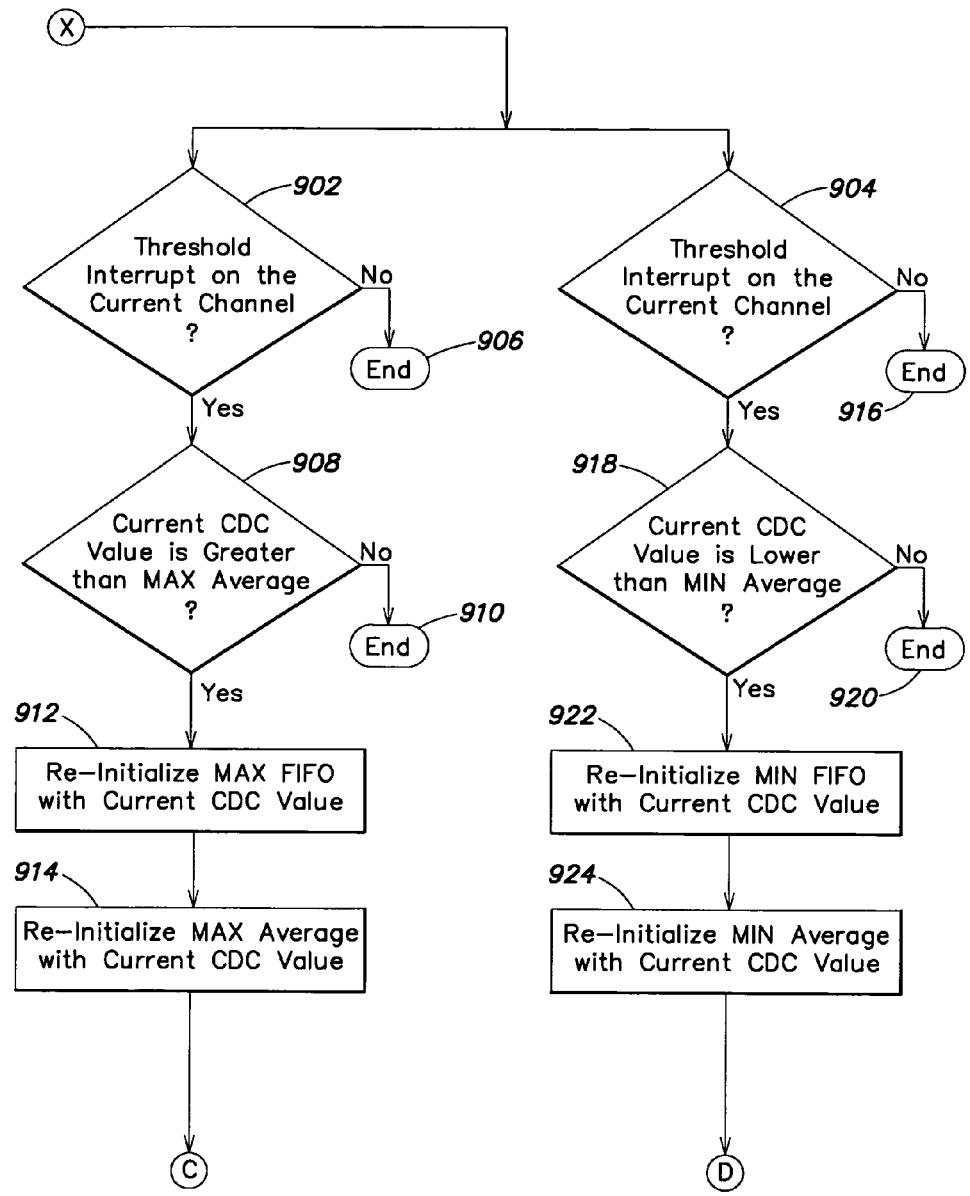

A typical operation according to this approach is shown in FIG. 6. In interval T1-T2, a fast update is performed of the Max FIFO and Max Average values. Then in interval T3-T4, a fast update is performed of the Min FIFO and Min Average values. The magnitude of the Max Average value steps up again during the T5-T6 interval, as does the magnitude (in a negative direction) of the Min Average value during interval T7-T8. When the CDC current value indicates the threshold is no longer exceeded, a monostable multivibrator operates to count out an appropriate time from T9-T10. At time T11, the monostable times out and the threshold values are updated according to the new Max and Min average values. At time T12, the current CDC value goes below the threshold. If the last CDC value is within (e.g.,) 20% of the Max average, the Max FIFO is updated using an averaging technique. At time T13, when the current CDC value goes above the threshold, the Min FIFO is updated using an averaging technique, provided the last "touched" value is within some range (e.g., 20%) of the Min average value. From time T14, the monostable again operates. When it stops, the Min and Max average values have changed; therefore, the threshold values are updated and the ambient value tracks environmental changes and the other curves are calibrated so as to track the changes in the ambient.

A block diagram of an illustrative example of an adaptation algorithm is shown in FIGS. 7A-7D. Quick Update Module 202 receives three inputs: (1) a signal on line 204 indicating the CDC output code value is inside the bounds of the minimum offset (ABS Minimum Offset; see below, "ABS" referring to absolute value) and maximum offset (ABS Maximum Offset; see below), and the threshold has been exceeded (i.e., threshold interrupt is detected); (2) the CDC value on line 206; and (3) a signal on line 208 representing a maximum average value of the current output of the CDC in the touched condition. If the current CDC value exceeds the upper or lower threshold and then exceeds the Max or Min average, respectively, then the Max or Min FIFO values, respectively, in FIFOs 212 and 214 are set equal by the Quick Update Module 202 to the current CDC value on line 206 until the Max or Min CDC value is reached during that particular touch incident. Thus, the ABS Minimum and Maximum Offsets are clamp values which stop much larger than expected CDC values from entering this block. For example, if the typical change expected from no touch to touch is 1000 codes, then the ABS Max. or Min. Offset values might be set to 2 to 5 times this value. This process is referred to as a quick update of the FIFO and the average values.

If the user does not apply a lot of pressure while touching the sensor, the Max and Min average values should be brought back within range slowly over time. This is done using an averaging technique and the process is referred to as the slow update process. Slow Update Module 222 calculates "slow" updating Max values with respect to the upper threshold, whereas by symmetry Slow Update Module 224 does likewise for the Min value for the lower threshold. Modules 222 and 224 receive their input from a two-element FIFO register 223 that, in turn, selectively receives CDC output code samples via a controlled switch 225A and a logic network 225B. Switch 225A is closed and delivers CDC output code samples when the CDC output code value is inside the bounds of the minimum offset and maximum offset, and the threshold has been exceeded. If the current CDC value processed by modules 222 and 224 exceeds the upper or lower thresholds and reaches a new Max or Min value which is greater than the threshold value plus a predetermined (preferably programmable) amount (e.g., 40-90% of the range from the threshold value to the Max or the Min average), then the Max or Min value in registers 212, 214 respectively, is updated with this new Max or Min value once the CDC value falls within the upper and lower threshold values.

Care should be taken to update the registers only once after each valid touch. The FIFO contents are then averaged to provide a new Max or Min average value.

Preferably, a boundary (not shown) is also placed on how close the Max or Min average values can be reduced toward the ambient value, to avoid the thresholds being adjusted too close to the ambient level. This value is initialized at the start of the algorithm.

When a user is not in contact with the sensor and proximity is not detected, the threshold algorithm calibrates normally and the upper and lower threshold values are adjusted based on the new Max and Min average values. Until a user comes into proximity or contact with the sensor, it is only necessary to adapt to environmental changes. As the environment changes, the ambient value on line 106 tracks these changes. A calculation module 230 adjusts the upper and lower threshold values as a function of the ambient value. During this calibration, the Max and Min FIFOs 212, 214 are also adjusted to track the ambient value. This is done by initializing all the values in the FIFO with a fixed offset supplied by subtracters 232, 234. This fixed offset corresponds to the current Max or Min average value less the ambient value. These upper and lower offsets from subtracters 232, 234 are also used to calculate the upper and lower threshold values as a function of the activation sensitivity setting for the sensor. For example, sixteen programmable sensitivity ranges may be used to position the thresholds between the ambient value and the upper and lower threshold values. Arithmetic modules 242, 244 calculate the upper and lower threshold values, using formulas such as provided below. The sixteen sensitivity settings (see FIG. 8) may range between (for example) 25% and 100% of the difference between the ambient value and the Max or Min average values. A sensitivity setting of 0 places the thresholds at the 25% value, making the sensor most sensitive. That means a small pressure will be required on the sensor to effect a valid touch. Conversely, a sensitivity setting of 15 (i.e., full scale), places the thresholds at the 100% value, making the sensor least sensitive. That is, a heavy touch will be needed to activate the sensor. (That is, a light touch involves only a small area of the user's finger being applied to the capacitor or an overlay, while a heavier touch brings more surface area into contact with the capacitor or capacitor overlay and thus results in a greater change in capacitance.) Experience has shown that a mid-range setting of 8 is optimal (in an approximate sense), but this will be dependent on the design and the user.

Figure 9:
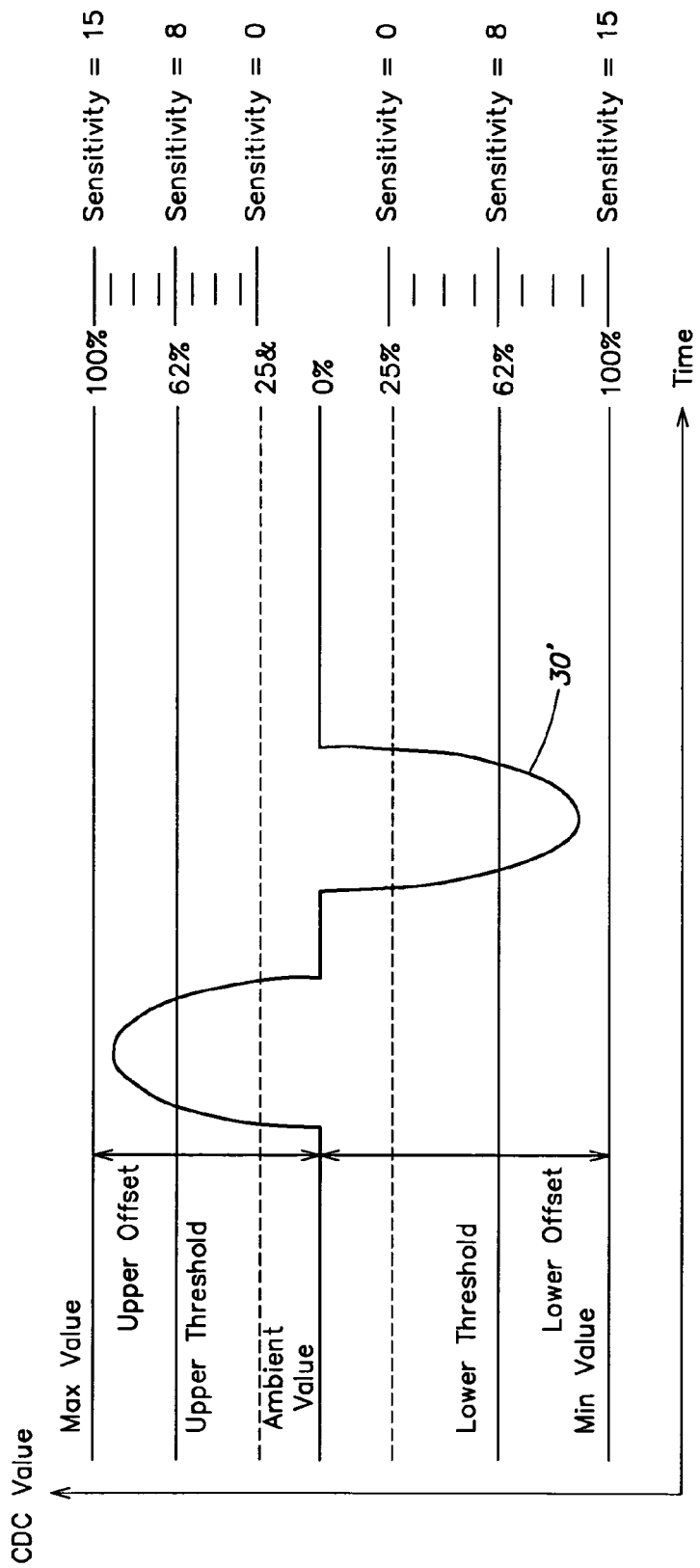
FIG. 9 is a diagrammatic illustration of the relationships used in the threshold adjustments of FIGS. 7A-7D and FIGS. 8A-8D.

The following (or similar) formulae may be used (e.g., in modules 242, 244) to calculate the thresholds:

$$UT = Amb + \left(\frac{UO}{4}\right) + \left(\frac{\left(UO - \frac{UO}{4}\right)}{16}\right) \times S = Amb + \left(\frac{UO}{4}\right) + \frac{3 \times UO \times S}{64}$$

$$LT = Amb - \left(\frac{LO}{4}\right) - \left(\frac{\left(LO - \frac{LO}{4}\right)}{16}\right) \times S = Amb - \left(\frac{UO}{4}\right) - \frac{3 \times LO \times S}{64}$$

where UT=Upper Threshold
Amb=the ambient value
UO=Upper Offset, sometimes referred to as the maximum average value
S=Sensitivity LT=Lower Threshold LO=Lower Offset, sometimes referred to as the minimum average value These relationships are illustrated in FIG. 9, showing the thresholds resulting from selected sensitivity settings. Note that these formulae do not, with a sensitivity scale from 0 to 15, allow the thresholds to collide with the maximum and minimum average values; a margin is built in.

The block diagram of FIGS. 7A-7D was used to show, diagrammatically, both a potential hardware implementation and an algorithm. Note that the invention is in no way intended to be limited to this example, which is presented for illustration purposes only.

Further understanding may be obtained from consideration of a conventionally-styled flow chart 800 expounding an implementation of the algorithm of FIGS. 7A-7D, which flow chart appears as FIGS. 8A-8D.

The process starts at entry point 802. The first act to be performed is a determination of whether a threshold interrupt has occurred (i.e., has been detected). This occurs at act 804. In the absence of a threshold interrupt, control branches to a calibration process, indicated by terminus 806 (connecting to other, matching terminus node indicators 806 on other drawing sheets). Two calibration paths are actuated (or entered), at nodes 808 and 810, respectively. From node 808, in act 812, the upper offset value is computed and set equal to the maximum average value less the ambient value on the current channel. A test is then made for the occurrence of a threshold interrupt and detection of a proximity signal on at least one channel, in act 814. If the test indicates that a threshold interrupt occurred and a proximity signal was asserted on at least one channel, the calibration ends, at terminus 816. On the other hand, if the test indicates the absence of a threshold interrupt or a proximity signal, then in act 818 a new upper threshold value is calculated and the calibration routine ends as noted at terminus 820. A similar process occurs with respect to the lower offset value. From node 810, in act 822, the lower offset value is computed and set equal to the ambient value on the current channel less the minimum average value. A test is then made for the absence of a threshold interrupt and absence of a proximity signal on all channels, in act 824. If the test indicates that either a threshold interrupt occurred or a proximity signal was asserted on at least one channel, the calibration ends, at terminus 826. On the other hand, if the test indicates the absence of a threshold interrupt and of proximity signals, then in act 828 a new lower threshold value is calculated, and the calibration routine ends, as indicated at terminus 830.

If, however, a threshold interrupt has been detected, then two-element FIFO register 223 is updated. Act 840. Processing then proceeds in parallel along two branches, the first branch starting at act 842 and the second, at act 844. Going down the first branch, in act 842, a decision or test is conducted to determine whether the value of the last element of FIFO 223 plus 10 (for example, or another appropriate value) is greater than the value of the first element. If the answer is negative, the process ends at terminus 846. If the answer is affirmative, then an update is performed to the temporary MAX (maximum) value, in act 848. Next, in act 850, a calculation is made of the average MAX value less the High Threshold value and a predetermined percentage of that amount is calculated. Then the result is added to the High Threshold value. Act 852. The resulting number is compared to the temporary MAX value of step 848 and if the former is greater than or equal to the temporary MAX value, the process ends at terminus 856; otherwise, control advances to act 858. There, the average MAX value is tested against the temporary MAX value. If the former is greater than or equal to the latter, the process ends at terminus 860. Otherwise, control proceeds to act 862, which is another testing operation. In act 862, the test is whether there has been detected a threshold interrupt on any channel. If there has been an interrupt, then the process ends at terminus 864. Otherwise, in act 866 the Max FIFO is updated with the temporary MAX value and then in act 868, the average MAX value is calculated.

Control proceeds from node 808 as indicated above.

Turning back to the second path that starts with act 844, such act is a test whether the value of the last element of FIFO 223 less 10 (for example, or another appropriate value) is less than the value of the first element. If the answer is negative, the process ends at terminus 870. Otherwise, control proceeds to act 872, wherein the temporary MIN value is updated. Then, in act 872, a calculation is made of the Low Threshold value less the Average MIN value and a predetermined percentage of that amount is calculated. Then the result is subtracted from the Low Threshold value. Act 876. The resulting number is compared to the temporary MIN value of step 872 and if the former is greater than or equal to the temporary MIN value, the process ends at terminus 880; otherwise, control advances to act 882. There, the Temporary MIN value is tested against the Average MIN value. If the former is less than or equal to the latter, the process ends at terminus 884. Otherwise, control proceeds to act 886, which is another testing operation. In act 886, the test is whether there has been detected a threshold interrupt on any channel. If there has been an interrupt, then the process ends at terminus 888. Otherwise, in act 890, the Min FIFO is updated with the temporary MIN value and then in act 892, the average MIN value is calculated.

Control proceeds from node 810 as indicated above.

Backing up on the flow chart, at the same time that the two-element FIFO is updated in act 840, two other processing chains are started, in parallel, beginning at acts 902 and 904.

In act 902, it is determined whether there is a threshold interrupt pending on the current channel. If the answer is negative, processing ends at terminus 906. If the answer is affirmative, processing continue to act 908. There, a test is performed to determine whether the current CDC output value is greater than the average MAX value. If the answer is negative, processing ends at terminus 910. If the answer is affirmative, then in act 912 the Max FIFO is re-initialized with the current CDC value and in act 914 the average MAX value is re-initialized to the same number. Control then proceeds to node 808.

On the parallel path, in act 904, it is determined whether there is a threshold interrupt pending on the current channel. If the answer is negative, processing ends at terminus 916. If the answer is affirmative, processing continue to act 918. There, a test is performed to determine whether the current CDC output value is lower than the average MIN value. If the answer is negative, processing ends at terminus 920. If the answer is affirmative, then in act 922 the Min FIFO is re-initialized with the current CDC value and in act 924 the average MIN value is re-initialized to the same number. Control then proceeds to node 810.

The foregoing is an example of a technique that may be used and presents another view of the information processing also depicted in FIGS. 7A-7D. It will be appreciated, of course, that the invention may be practiced in other implementations.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of operating a capacitive sensor assembly comprising at least one capacitive sensor element and a capacitance-to-digital converter (CDC) that supplies output codes corresponding to sensor element capacitance, comprising acts of:
   a. detecting changes in an ambient electric field value associated with the at least one capacitive sensor element;
   b. modifying at least one threshold value in response to changes in said ambient electric field value, wherein the at least one threshold value is used to determine whether a part of a human body has touched the at least one sensor element;
   c. determining whether or not proximity of the part of a human body to the at least one sensor element exists, wherein proximity comprises a part of the human body being close to, but not touching, the at least one sensor element, wherein determining further comprises:
      (i) filtering data associated with an output of the CDC for the at least one sensor element with a first filter to generate a first filtered output;
      (ii) filtering data associated with an output of the CDC for the at least one sensor element with a second filter to generate a second filtered output, wherein the second filtered output is different from the first filtered output; and
      (iii) determining whether or not proximity exists based on at least one of a first proximity condition being true or a second proximity condition being true, wherein the first proximity condition is based on a comparison between the first filtered output and its associated threshold, and wherein the second proximity condition is based on a comparison between the second filtered output and its associated threshold; and
   d. preventing the modification of one or more threshold values while proximity is determined to exist.

2. The method of claim 1, wherein the part of the human body comprises a finger.

3. The method of claim 1, further comprising generating an output signal indicating when a CDC output code exceeds in magnitude a respective threshold value.

4. The method of claim 1 wherein modifying at least one threshold value comprises modifying said threshold in dependence on a sensitivity setting to vary an amount of pressure required to signal a valid touch on the sensor element.

5. The method of claim 4 wherein said threshold is modified in dependence on a combination of a sensitivity setting and a history of CDC code variation.

6. The method of claim 4 wherein modifying at least one threshold value further comprises modifying said threshold in dependence on an offset value.

7. The method of claim 4 wherein modifying at least one threshold value further comprises employing ambient, maximum CDC value and minimum CDC value as well as a sensitivity setting to provide a threshold that adapts sensor response to external conditions.

8. The method of claim 7 wherein said external conditions may include one or more of an environmental condition and a user's finger size.

9. The method of claim 1 wherein detecting changes in the ambient electric field value comprises computing the ambient electric field value as a moving average of values associated with electric field of the capacitive sensor element.

10. The method of claim 1 further comprising performing re-calibration of detecting changes in the ambient electric field value after a predetermined time period has elapsed after halting detecting changes in the ambient electric field value.

11. The method of claim 1 wherein detecting proximity further comprises determining that a magnitude of a difference between a Fast Filter average signal value and the ambient electric field value is greater than a predetermined amount, wherein ambient electric field value is generated by a much longer series of measurements than the Fast Filter average signal value.

12. The method of claim 1 wherein detecting proximity further comprises comparing a currently observed sensor value with a previously observed sensor value, and determining proximity based at least partly on the comparison.

13. The method of claim 1, wherein:
   filtering data with the first filter further comprises computing a magnitude of a difference between two CDC values observed at different times; and
   filtering data with the second filter further comprises generating a moving average of CDC values and computing a magnitude of a difference between two moving average values observed at different times.

14. A method of operating a capacitive sensor assembly having at least one capacitive sensor element and a capacitance-to-digital converter (CDC) that supplies output codes corresponding to sensor element capacitance, the method comprising:
   a. performing ambient electric field value calibration of a CDC output, wherein calibration comprises measuring changes in an ambient electric field value associated with a capacitor sensor element;
   b. performing a proximity algorithm to detect at least one condition interpreted as indicating that a part of a human body is close to, but not touching, the sensor element, wherein touching of the sensor element is detected separately from the proximity algorithm, the proximity algorithm employing first and second moving average filters to monitor the CDC output values over time to detect said at least one condition, wherein performing the proximity algorithm further comprises:
      (i) filtering data associated with the CDC output for the sensor element with the first filter to generate a first filtered output;
      (ii) filtering data associated with the CDC output for the sensor element with the second filter to generate a second filtered output, wherein the second filtered output is different from the first filtered output; and
      (iii) detecting the at least one condition based on at least one of a first comparison between the first filtered output and its associated threshold or a second comparison between the second filtered output and its associated threshold; and
   c. halting ambient electric field value calibration of the CDC output when the proximity algorithm indicates said at least one condition persists.

15. The method of claim 14 wherein said first and second filters comprise, respectively, a fast filter and a slow filter, the fast filter receiving the CDC output values and averaging a predetermined number of CDC output values to produce a sequence of Fast Filter Average values; the Slow Filter receiving the Fast Filter Average values and generating a new output value only if proximity of a ground mass is not detected and the CDC output values are changing relatively slowly.

16. The method of claim 14, wherein:
filtering data with the first filter further comprises computing a magnitude of a difference between two CDC values observed at different times; and
filtering data with the second filter further comprises generating a moving average of CDC values and computing a magnitude of a difference between two moving average values observed at different times.

17. A method of operating a capacitive sensor assembly having at least one capacitive sensor element and a capacitance-to-digital converter (CDC) that supplies output codes corresponding to sensor element capacitance, the method comprising:
 a. using a multi-step proximity algorithm, detecting from an output of the CDC at least one condition indicative of a user being close to, but not touching, a sensor element; and
 b. halting measurement of changes in an ambient electric field value of the sensor assembly while said at least one condition persists;
 wherein the proximity algorithm employs at least a first step and a second step to distinguish environmental drift from proximity induced pseudo-drift;
 wherein the first step comprises:
  filtering data associated with the output of the CDC for the sensor element with a first filter to generate a first filtered output; and
  comparing the first filtered output and its associated threshold to determine whether or not a first proximity condition exists;
 wherein the second step comprises:
  filtering data associated with the output of the CDC for the sensor element with a second filter to generate a second filtered output, wherein the second filter is different from the first filter; and
  comparing the second filtered output and its associated threshold to determine whether or not a second proximity condition exists.

18. The method of claim 17 wherein the different criteria include different averaging of CDC output values.

19. The method of claim 17, wherein:
filtering data with the first filter further comprises computing a magnitude of a difference between two CDC values observed at different times; and
filtering data with the second filter further comprises generating a moving average of CDC values and computing a magnitude of a difference between two moving average values observed at different times.

20. A calibration assembly for use with a capacitive sensor assembly having at least one capacitive sensor element and a capacitance-to-digital converter (CDC) that supplies output codes corresponding to sensor element capacitance, comprising a processor executing one or more sequences of program instructions to:
 a. detect changes in an ambient electric field value associated with the at least one capacitive sensor element;
 b. modify at least one threshold value in response to changes in said ambient electric field value, wherein the at least one threshold value is used to determine whether a part of a human body has touched the at least one sensor element; and
 c. detect proximity of the part of a human body to the at least one sensor element exists, wherein proximity comprises a part of the human body being close to, but not touching, the at least one sensor element, wherein the program instructions to detect proximity further comprise program instructions to:
  (i) filter data associated with an output of the CDC for the at least one sensor element with a first filter to generate a first filtered output;
  (ii) filter data associated with an output of the CDC for the at least one sensor element with a second filter to generate a second filtered output, wherein the second filtered output is different from the first filtered output; and
  (iii) determine whether or not proximity exists based on at least one of a first proximity condition being true or a second proximity condition being true, wherein the first proximity condition is based on a comparison between the first filtered output and its associated threshold, and wherein the second proximity condition is based on a comparison between the second filtered output and its associated threshold; and
 (d) prevent the modification of the at least one threshold value while said proximity is detected.

21. The calibration assembly of claim 20, wherein the processor further executes instructions to generate an output signal indicating when a CDC output code exceeds in magnitude a respective threshold value.

22. The calibration assembly of claim 20 wherein modifying at least one threshold value comprises modifying said threshold in dependence on a sensitivity setting to vary an amount of pressure required to signal a valid touch on the sensor element.

23. The calibration assembly of claim 22 wherein modifying at least one threshold value further comprises modifying said threshold in dependence on an offset value.

24. The assembly of claim 22 wherein modifying said threshold in dependence on a sensitivity setting further comprises employing ambient, maximum CDC value and minimum CDC value as well as a sensitivity setting to provide a threshold that adapts sensor response to external conditions.

25. The calibration assembly of claim 20, wherein:
the program instructions to filter data with the first filter further comprise program instructions to compute a magnitude of a difference between two CDC values observed at different times; and
the program instructions to filter data with the second filter further comprise program instructions to generate a moving average of CDC values and computing a magnitude of a difference between two moving average values observed at different times.

26. A calibration assembly comprising:
capacitive sensor assembly having at least one capacitive sensor element;
a capacitance-to-digital converter (CDC) that supplies output codes corresponding to sensor element capacitance; and
a processor executing instructions to:
 a. perform ambient electric field value calibration of a CDC output, wherein calibration comprises measuring changes in an ambient electric field value associated with the capacitive sensor element;
 b. perform a proximity algorithm to detect at least one condition indicating that a part of a human body is close to, but not touching, the at least one capacitive sensor element, wherein touching of the sensor element is detected separately from the proximity algorithm, the proximity algorithm employing first and second moving average filters to monitor the CDC output values over time to detect said at least one condition, wherein the instructions to perform the proximity algorithm further comprise instructions to:

(i) filter data associated with the CDC output for the sensor element with the first filter to generate a first filtered output;
(ii) filter data associated with the CDC output for the sensor element with the second filter to generate a second filtered output, wherein the second filtered output is different from the first filtered output; and
(iii) detect the at least one condition based on at least one of a first comparison between the first filtered output and its associated threshold or a second comparison between the second filtered output and its associated threshold; and c. halt ambient electric field value calibration of the CDC output when the proximity algorithm indicates said at least one condition persists.

27. The calibration assembly of claim 26 wherein said first and second filters comprise, respectively, a fast filter and a slow filter, the fast filter receiving the CDC output values and averaging a predetermined number of CDC output values to produce a sequence of Fast Filter Average values; the Slow Filter receiving the Fast Filter Average values and generating a new output value only if proximity of a ground mass is not detected and the CDC output values are changing relatively slowly.

28. The calibration assembly of claim 26, wherein:
the instructions to filter data with the first filter further comprise instructions to compute a magnitude of a difference between two CDC values observed at different times; and
the instructions to filter data with the second filter further comprise instructions to generate a moving average of CDC values and computing a magnitude of a difference between two moving average values observed at different times.

29. A calibration assembly comprising:
a capacitive sensor assembly having at least one capacitive sensor element;
a capacitance-to-digital converter (CDC) that supplies output codes corresponding to sensor element capacitance; and
a processor adapted to:
a. use a multi-step proximity algorithm to detect from an output of the CDC at least one proximity condition indicative of a part of a human body being close to, but not touching, a sensor element such that environmental drift can be distinguished from proximity-induced pseudo drift, wherein the multi-step proximity algorithm comprises:
a first filter configured to filter data associated with the output of the CDC for the sensor element to generate a first filtered output; and
one or more blocks configured to compare the first filtered output and its associated threshold to determine whether or not a first proximity condition exists;
a second filter configured to filter data associated with the output of the CDC for the sensor element to generate a second filtered output, wherein the second filter is different from the first filter; and
one or more blocks configured to compare the second filtered output and its associated threshold to determine whether or not a second proximity condition exists; and
b. halt ambient electric field value calibration of the sensor assembly while said at least one condition persists.

30. The assembly of claim 29 wherein the different criteria include different averaging of CDC output values.

31. The assembly of claim 29 wherein the different criteria include at least two different methods to distinguish environmental drift from proximity-induced pseudo-drift.

32. The calibration assembly of claim 29, wherein:
the first filter is further configured to compute a magnitude of a difference between two CDC values observed at different times; and
the second filter is further configured to generate a moving average of CDC values and to compute a magnitude of a difference between two moving average values observed at different times.

* * * * *